(12) United States Patent
Hayasi

(10) Patent No.: US 6,897,547 B2
(45) Date of Patent: May 24, 2005

(54) SEMICONDUCTOR DEVICE INCLUDING BIPOLAR JUNCTION TRANSISTOR, AND PRODUCTION METHOD THEREFOR

(75) Inventor: Kouzi Hayasi, Kanagawa (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 10/673,476

(22) Filed: Sep. 30, 2003

(65) Prior Publication Data

US 2004/0061133 A1 Apr. 1, 2004

(30) Foreign Application Priority Data

Oct. 1, 2002 (JP) ......................................... 2002-288777

(51) Int. Cl.[7] .................... H01L 27/082; H01L 27/102; H01L 29/70; H01L 31/11
(52) U.S. Cl. ....................... 257/593; 257/584; 257/587; 257/588
(58) Field of Search ...................... 257/565, 577–579, 257/584, 587–588, 593, 728; 438/334, 366

(56) References Cited

U.S. PATENT DOCUMENTS

| | | | |
|---|---|---|---|
| 5,965,930 A | 10/1999 | Sakamoto et al. | |
| 6,069,404 A | * 5/2000 | Aufinger et al. | ............ 257/728 |
| 6,188,123 B1 | * 2/2001 | Tsukamoto | ................. 257/565 |
| 2003/0015765 A1 | * 1/2003 | Yamashita et al. | .......... 257/477 |

FOREIGN PATENT DOCUMENTS

| | | |
|---|---|---|
| EP | 0 382 504 A2 | 8/1990 |
| EP | 0 395 862 A2 | 11/1990 |
| EP | 1 061 572 A1 | 12/2000 |
| JP | 64-73669 A | 3/1989 |
| JP | H10-163332 A | 6/1998 |
| JP | 10-247713 A | 9/1998 |

OTHER PUBLICATIONS

N. Camilleri et al., "Bonding Pad Models for Silicon VLSI Technologies and Their Effects on the Noise Figure of RF NPNs", Microwave Symposium Digest, 1994, pp. 1179–1182.

* cited by examiner

Primary Examiner—Shouxiang Hu
(74) Attorney, Agent, or Firm—Sughrue Mion, PLLC

(57) ABSTRACT

A semiconductor device includes a low resistance semiconductor substrate, a high resistance semiconductor layer formed on the substrate, an insulation layer formed on the semiconductor layer, and a transistor element composed of a collector region, abase region, and an emitter region formed in the semiconductor layer. The device further includes an emitter electrode formed in the insulation layer to be connected to the emitter region, a sub-emitter electrode formed in the insulation layer connected to the emitter electrode, a low resistance impurity-diffusion region formed in the semiconductor layer such that the sub-emitter electrode is connected to the substrate through the impurity-diffusion region, a base electrode formed in the insulation layer to be connected to the base region, and a base-bonding pad formed on the insulation layer to be connected to the base electrode. The base-bonding pad is placed on the insulation layer above the impurity-diffusion region to be at least partially encompassed with the impurity-diffusion region.

10 Claims, 25 Drawing Sheets

SEMICONDUCTOR DEVICE INCLUDING BIPOLAR JUNCTION TRANSISTOR, AND PRODUCTION METHOD THEREFOR

BACKGROUND OF THE INVENTION

1. Field of the Invention

The present invention relates to a semiconductor device including a bipolar junction transistor, and a production method for producing such a semiconductor device.

2. Description of the Related Art

As a representative type of bipolar junction transistor (BJT), an emitter-grounded type high frequency BJT is well known. For example, the emitter-grounded type high frequency BJT is disclosed in Japanese Laid-Open Patent Publications (KOKAI) No. SHO-64-073669 and No. HEI-10-247713.

As disclosed in these publications by way of example, the emitter-grounded type high frequency BJT comprises a $p^+$-type substrate, a $p^-$-type epitaxial layer formed on the $p^+$-type substrate, and an $n^-$-type epitaxial layer formed on the $p^+$-type substrate. The $p^-$-type epitaxial layer has a collector-buried region formed therein, and the $n^-$-type epitaxial layer has a collector-contact region formed therein and electrically connected to the collector-buried region. Also, the $n^-$-type epitaxial layer has a base region formed therein and disposed above the collector-buried region, and an emitter region formed in the base region. Further, the $p^-$-type epitaxial layer has a $p^+$-type buried diffusion region formed therein beside the collector-buried region, and the $n^-$-type epitaxial layer has a $p^+$-type channel stopper region formed therein and electrically connected to the $p^+$-type buried diffusion region.

The BJT also comprises an insulation layer formed on the $n^-$-type epitaxial layer. Three openings are perforated in the insulation layer such that the collector-contact, base, and emitter regions are exposed to the outside, and are filled with a suitable conductive material, resulting in formation of collector, base, and emitter electrodes electrically connected to the respective collector-contact, base and emitter regions. Also, an additional opening is perforated in the insulation layer such that the $p^+$-type channel stopper region is exposed to the outside, and is filled with a suitable conductive material, resulting in formation of a sub-emitter electrode electrically connected to the $p^+$-type channel stopper region.

The BJT further comprises a wiring pattern formed on the insulation layer, and the wiring pattern includes a conducting path for connecting the emitter electrode and the sub-emitter electrode to each other. Thus, the emitter region is connected to the $p^+$-type substrate through the intermediary of the emitter electrode, the conducting path, the sub-emitter electrode, the $p^+$-type channel stopper region, and the $p^+$-type buried diffusion region. Namely, the electrical connection of the emitter electrode to the $p^+$-type substrate is established in an interior of the BJT without using any bonding-wire.

Usually, the $p^+$-type substrate has a metallized layer formed on the bottom or rear surface thereof, with the metallized layer being suitably grounded when the BJT is used. Namely, the grounding of the emitter region is carried out without using any bonding-wire.

As is apparent from the foregoing, in the above-mentioned conventional BJT, no bonding-wire is used to establish the electrical connection for the emitter electrode. Thus, it is possible to considerably suppress an increase of impedance and a voltage drop, in comparison with a case where a bonding-wire is used to establish the electrical connection for the emitter electrode. Therefore, in the BJT, a high-frequency characteristic and gain can be considerably improved.

On the other hand, the conventional BJT is provided with a base-bonding pad and collector-bonding pad formed on the insulation layer, the respective base-bonding and collector-bonding pads are connected to the base and collector electrodes by conducting paths included in the aforesaid wiring pattern. After the BJT is mounted on a lead frame, the respective base-bonding and collector-bonding pads are electrically connected to predetermined leads of the lead frame, using bonding-wires. Each of the base-bonding and collector-bonding pads has a considerably larger size in comparison with the size of the base and collector electrodes, such that the bonding wires can be surely bonded to each pad.

With the arrangement of the aforesaid conventional BJT, the base-bonding pad may be placed above the high resistance $p^-$-type epitaxial layer such that the insulation layer and the channel stopper region or high concentration $p^+$-type diffusion region are intervened therebetween. Thus, when thermal noises are generated in the p-type epitaxial layer, they are input to the base-bonding pad through a parasitic capacitance produced due to the insulation layer which serves as a dielectric, resulting in decline in a noise factor (NF) characteristic of the BJT.

SUMMARY OF THE INVENTION

Therefore, a main object of the present invention is to provide a semiconductor device including a bipolar junction transistor, which is constituted such that not only can a high-frequency characteristic and gain be improved, but also it is possible to prevent decline in a noise factor (NF) characteristic.

Another object of the present invention is to provide a production method for producing such a semiconductor device.

In accordance with a first aspect of the present invention, there is provided a semiconductor device comprising a low resistance semiconductor substrate, a high resistance semiconductor layer formed on the low resistance semiconductor substrate, an insulation layer formed on the high resistance semiconductor layer, and a transistor element composed of a collector region, a base region, and an emitter region which are formed in the high resistance semiconductor layer. The semiconductor device further comprises an emitter electrode formed in the insulation layer so as to be electrically connected to the emitter region, a sub-emitter electrode formed in the insulation layer electrically connected to the emitter electrode, a low resistance impurity-diffusion region formed in the high resistance semiconductor layer such that the sub-emitter electrode is electrically connected to the low resistance semiconductor substrate through the low resistance impurity-diffusion region, a base electrode formed in the insulation layer so as to be electrically connected to the base region, and a base-bonding pad formed on the insulation layer so as to be electrically connected to the base electrode. According to the present invention, the base-bonding pad is placed on the insulation layer above the low resistance impurity-diffusion region so as to be at least partially encompassed with the low resistance impurity-diffusion region. When the semiconductor device is used, the low resistance semiconductor substrate is grounded.

The electrical connection between the emitter electrode and the sub-emitter electrode may be established by a conducting path formed on the insulation layer, and the electrical connection between the base electrode and the base-bonding pad may be established by a conducting path (P2) formed on the insulation layer.

Preferably, the insulation layer includes a conductive layer buried therein and electrically connected to the sub-emitter electrode, and the conductive layer is placed so as to at least partially encompass the base-bonding pad.

A part of the base-bonding pad may be encompassed with the low resistance impurity-diffusion region. In this case, it is preferable that the remaining part of the base-bonding pad is encompassed with the conductive layer.

The semiconductor device may further comprise a first wiring pattern formed on the insulation layer, an additional insulation layer formed between the insulation layer and both the base-bonding pad and the first wiring pattern, a second wiring pattern formed on the additional insulation layer, an additional emitter electrode formed in the additional insulation layer so as to be electrically connected to the emitter electrode, an additional sub-emitter electrode formed in the additional insulation layer so as to be electrically connected to the sub-emitter electrode, an additional base electrode formed in the additional insulation layer so as to be electrically connected to the base electrode; and an additional base-bonding pad formed on the additional insulation layer so as to be electrically connected to the base-bonding pad.

The sub-emitter electrode may have a grounded shield which is integrally extended therefrom between the insulation layer and the additional insulation layer so as to encompass the base-bonding pad.

Also, the second wiring pattern may include a conducting path for establishing an electrical connection between the additional emitter electrode and the additional sub-emitter electrode, and another conducting path for establishing an electrical connection between the base electrode and the base-bonding pad.

When the low resistance semiconductor substrate exhibits a first conductivity type, the high resistance semiconductor layer includes a first high resistance epitaxial layer section formed on the low resistance semiconductor substrate and exhibiting the first conductivity type, and a second high resistance layer section formed on the first high resistance epitaxial layer and exhibiting a second conductivity type opposite to the first conductivity type. Also, the low resistance impurity-diffusion region includes a first low resistance impurity-diffusion region section formed in the first high resistance epitaxial layer section and exhibiting the first conductivity type, and a second low resistance impurity-diffusion region section formed in the second high resistance epitaxial layer section and exhibiting the first conductivity type. The second low resistance impurity-diffusion region section may be formed as a channel stopper region exhibiting the first conductivity type.

In accordance with a second aspect of the present invention, there is provided a production method for producing a semiconductor device comprising the steps of growing a first high resistance epitaxial layer of a first conductivity type on a low resistance semiconductor substrate of the first conductivity type, forming a low resistance impurity-diffusion region of the first conductivity type in the first high resistance epitaxial layer so as to be electrically connected to the low resistance semiconductor substrate, forming a low resistance collector-buried region of a second conductivity type opposite to the first conductivity type in the first high resistance epitaxial layer, growing a second high resistance epitaxial layer of the second conductivity type on the first high resistance epitaxial layer having the low resistance collector-buried region, forming a low resistance collector-contact region of the second conductivity type formed in the second high resistance epitaxial layer so as to be electrically connected to the low resistance collector-buried layer, forming a sub-emitter region in the second high resistance epitaxial layer so as to be electrically connected to the low resistance impurity-diffusion region, forming a base region of the first conductivity type on the second high resistance epitaxial layer above the low resistance collector-buried region, forming an emitter region of the second conductivity type formed on the base region, forming an insulation layer on the second high resistance epitaxial layer, forming base, emitter, collector sub-emitter electrodes connected to the base, emitter, collector-contact, and sub-emitter regions, respectively, and a base-bonding pad formed on the insulation layer so as to be encompassed with the sub-emitter region.

The production method may further comprise forming a conductive layer in the insulation layer so as to at least partially encompass the base-bonding pad, and the conductive layer being electrically connected to the sub-emitter electrode.

Also, in the production method, the sub-emitter region may be formed as a channel stopper region so as to at least partially encompass the base-bonding pad.

BRIEF DESCRIPTION OF THE DRAWINGS

The above objects and other objects will be more clearly understood from the description set forth below, with reference to the accompanying drawings, wherein.

DESCRIPTION OF THE PREFERRED EMBODIMENTS

Figure 1:
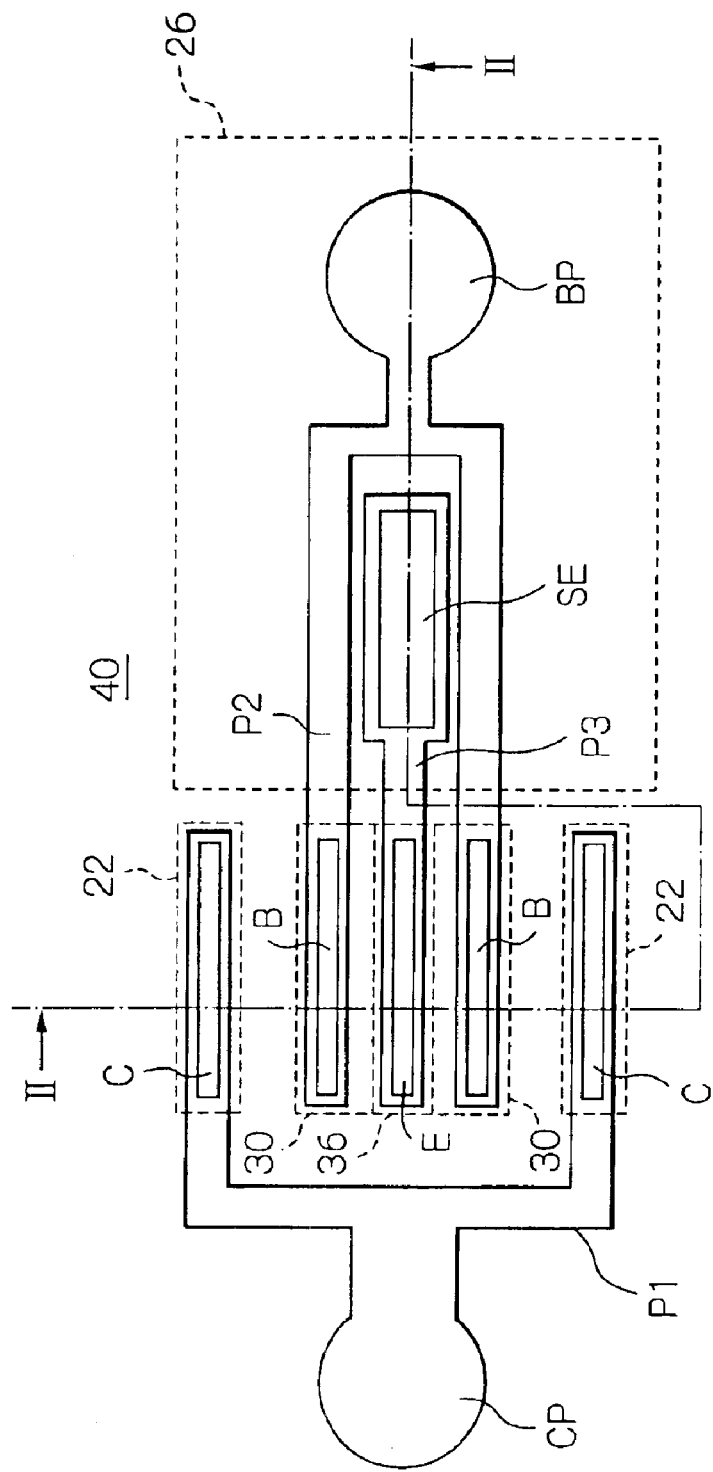
FIG. 1 is a plan view of a first embodiment of a semiconductor device including a bipolar junction transistor according to the present invention.
Figure 2:
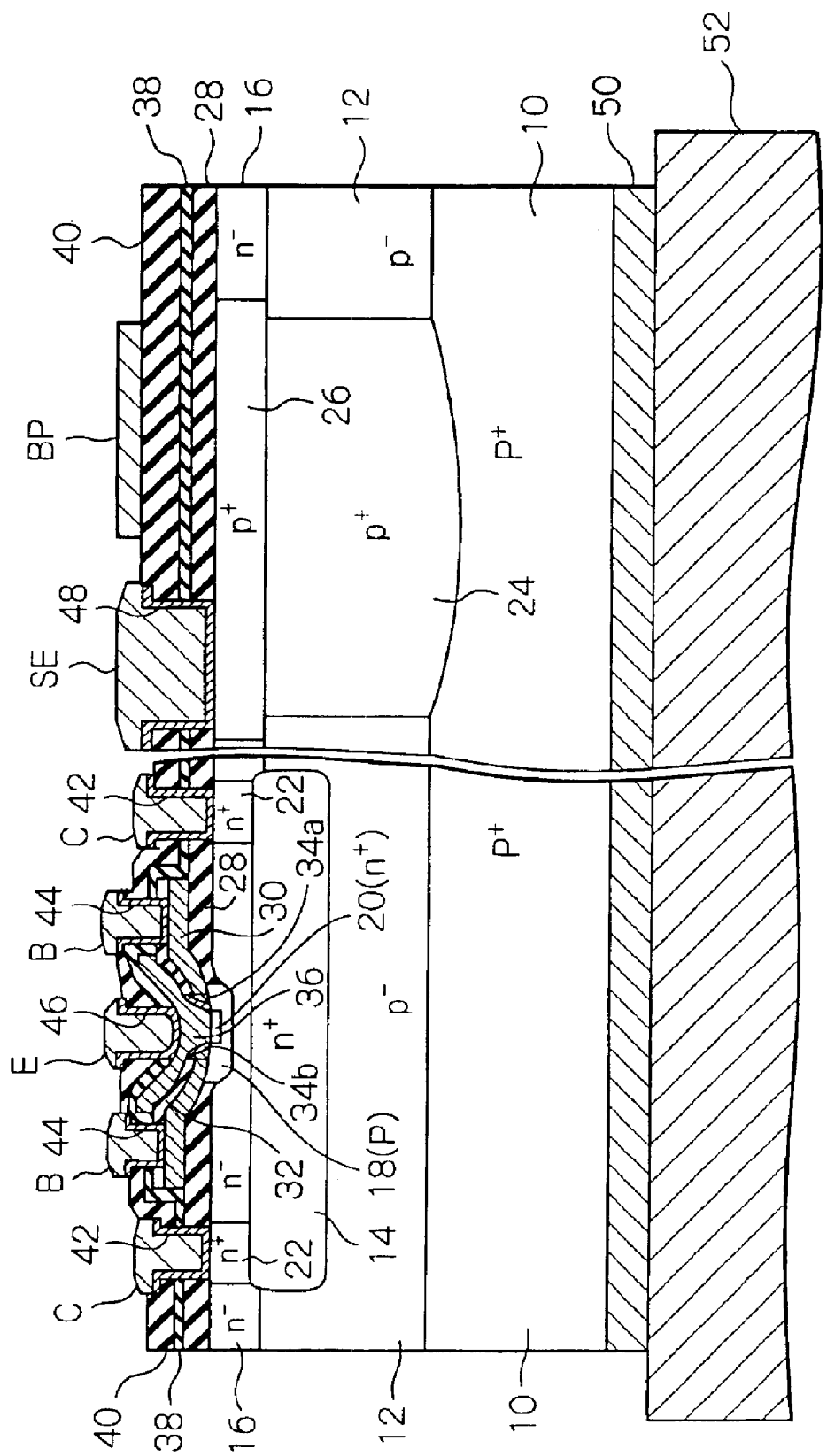
FIG. 2 is a cross-sectional view of the semiconductor device, taken along the II—II line of FIG. 1.
Figure 3:
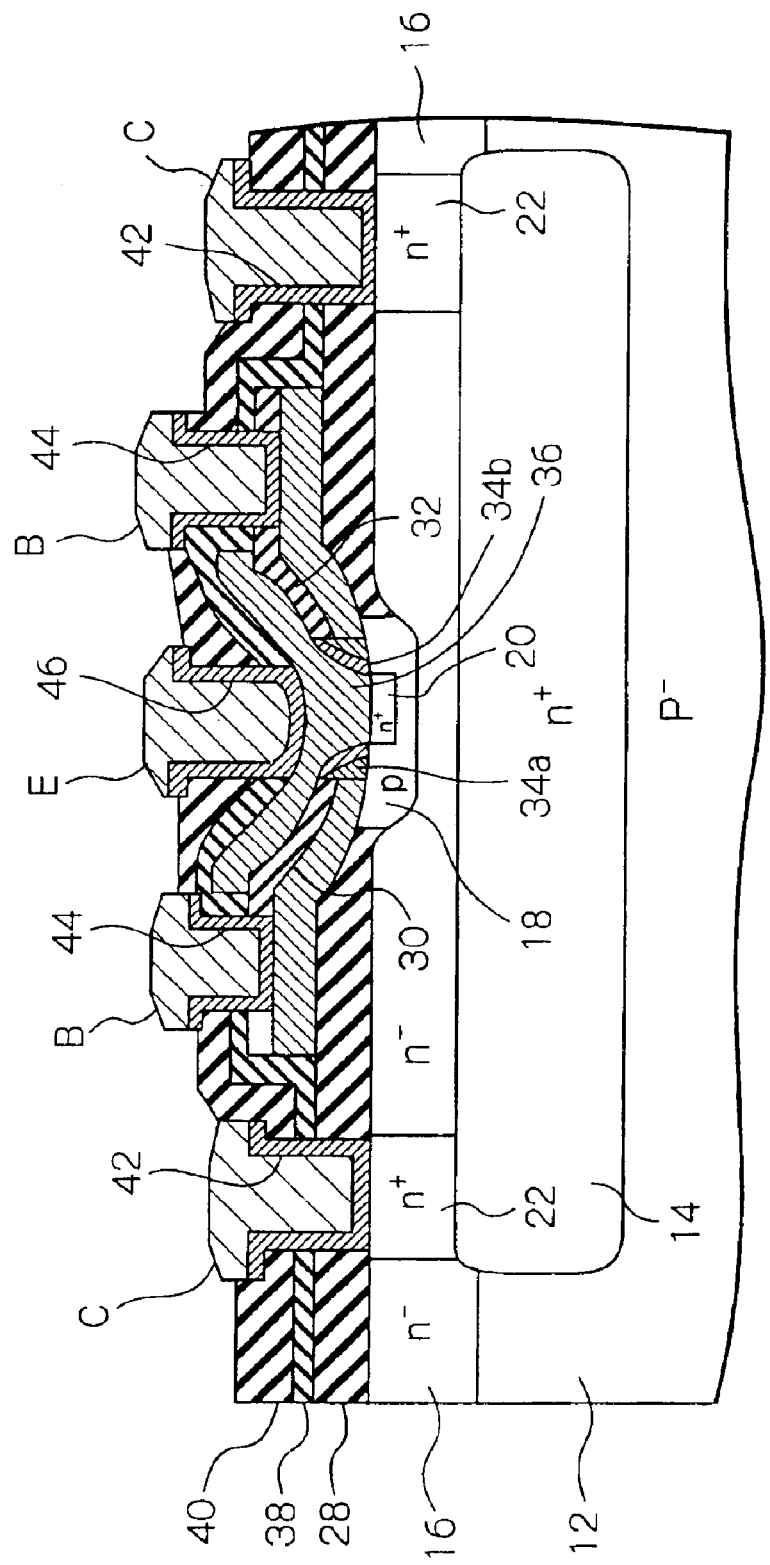
FIG. 3 is a partial enlarged view of FIG. 2.

Referring to FIGS. 1, 2, and 3, a first embodiment of a semiconductor device including a bipolar junction transistor (BJT) according to the present invention is shown. Note, FIG. 1 shows the semiconductor device as a plan view, and FIG. 2 shows a cross section of the semiconductor device, taken along the II—II line of FIG. 1.

As shown in FIG. 2, the semiconductor device includes a high concentration/low resistance $p^+$-type substrate 10, which is derived from a $p^+$-type diffusion layer formed on a silicon wafer (not shown), and a low concentration/high resistance $p^-$-type epitaxial layer 12 formed on the high concentration/low resistance $p^+$-type substrate 10. A high concentration/low resistance $n^+$-type collector-buried region 14 is formed in an element-formation area previously defined on the $p^-$-type epitaxial layer 12.

The semiconductor device also includes a low concentration/high resistance $n^-$-type epitaxial layer 16 formed on the $p^-$-type epitaxial layer 12 having the $n^+$-type collector-buried region 14 formed therein. As best shown in FIG. 3, a p-type base region 18 is formed in the $n^-$-type epitaxial layer 16, and an $n^+$-type emitter region 20 is formed in the p-type base region 18. Also, in this embodiment, a pair of $n^+$-type collector-contact regions 22 are formed in the $n^-$-type epitaxial layer 16 so as to be in contact with the $n^+$-type collector-buried region 14. Namely, each of the $n^+$-type collector-contact regions 22 extends through the $n^-$-type epitaxial layer 16.

On the other hand, as shown in FIG. 2, a high concentration/low resistance $p^+$-type diffusion buried region 24 is formed in an element-isolation area defined on the $p^-$-type epitaxial layer 12, so as to be in contact with the $p^+$-type substrate 10. Namely, the $p^+$-type diffusion buried region 24 extends through the $p^-$-type epitaxial layer 12. Further, a high concentration/low resistance $p^+$-type sub-emitter region 26 is formed in the $n^-$-type epitaxial layer 16 so as to be arranged over the $p^+$-type diffusion buried layer 24. Namely, the $p^+$-type sub-emitter region 26 extends through the $n^-$-type epitaxial layer 16, and is in contact with the $p^+$-type diffusion buried layer 24.

The semiconductor device further includes a first insulation layer 28 formed on the $n^-$-type epitaxial layer 16. A first contact opening is perforated in the first insulation layer 28 to thereby expose the p-type base region 18 and the $n^+$-type emitter region 20. As best shown in FIG. 3, a first polycrystalline silicon layer 30 is formed on the first insulation layer 28 so as to cover the first contact opening, and a second insulation layer 32 is formed on the first polycrystalline silicon layer 30.

As best shown in FIG. 3, a second contact opening, having a larger area than that of the $n^+$-type emitter region 20, is formed in both the first polycrystalline silicon layer 30 and the second insulation layer 32 to thereby expose the $n^+$-type emitter region 20, and first and second side walls 34a and 34b are formed in order along an inner peripheral wall of the second contact opening. In this embodiment, the first side wall 34a is composed of silicon nitride, and the second side wall 34b is composed of silicon dioxide. Also, a second polycrystalline silicon layer 36 is formed on the second insulation layer 32 so as to cover the second contact opening perforated in both the first polycrystalline silicon layer 30 and the second insulation layer 32. In short, the first polycrystalline silicon layer 30 is in contact with the p-type base region 18 due to the perforation of the first contact opening, and the second polycrystalline silicon layer 36 is in contact with the $n^+$-type emitter region 20 due to the perforation of the second contact opening.

Furthermore, the semiconductor device includes a third insulation layer 38 formed on the first insulation layer 28 and the second polycrystalline silicon layer 36, and a fourth insulation layer 40 formed on the third insulation layer 38.

A pair of collector-contact holes are perforated in the first, third, and fourth insulation layers 28, 38, and 40, to thereby expose the n⁺-type collector-contact regions 22. An interior of each collector-contact hole is coated with a suitable metal to thereby form a barrier metal layer 42, and is filled with a conductive material such as metal or the like, resulting in formation of collector electrodes C.

Also, a pair of base-contact holes are perforated in the second, third fourth insulation layers 36, 38, and 40, to thereby expose two local areas of the first polycrystalline silicon layer 30, which is in contact with the p-type base region 18. An interior of each base-contact hole is coated with a suitable metal to thereby form a barrier metal layer 44, and is filled with a conductive material such as metal or the like, resulting in formation of base electrodes B.

Further, an emitter-contact hole is perforated in the third and fourth insulation layers 38 and 40, to thereby expose a local area of the second polycrystalline silicon layer 36, which is in contact with the n⁺-type emitter region 20. An interior of the emitter-contact hole is coated with a suitable metal to thereby form a barrier metal layer 46, and is filled with a conductive material such as metal or the like, resulting in formation of an emitter electrode E. In addition, as shown in FIG. 2, a sub-emitter-contact hole is perforated in the first, third, and fourth insulation layers 28, 38, and 40, to thereby expose a local area of the p⁺-type sub-emitter region 26. An interior of the sub-emitter-contact hole is coated with a suitable metal to thereby form a barrier metal layer 48, and is filled with a conductive material such as metal or the like, resulting in formation of a sub-emitter electrode SE.

For example, each of the barrier metal layers 42, 44, 46, and 48 may be composed of titanium (T), titanium/tungsten (TW) or the like, and each of the electrodes C, B, E, and SE may be composed of aluminum (Al), gold (Au) or the like.

When the aforesaid electrodes C, B, E, and SE are formed, both a collector-bonding pad CP and a base-bonding pad BP are simultaneously formed on the fourth insulation layer 40, as shown in FIG. 1. After the formations of the electrodes C, B, E, and SE and the bonding pads CP and BP, a wiring pattern is formed on the fourth insulation layer 40. As shown in FIG. 1, the wiring pattern has a first conducting path P1 for connecting the collector-electrodes C to the collector-bonding pad CP, a second conducting path P2 for connecting the base electrodes B to the base-bonding pad BP, and a third conducting path P3 for connecting the emitter electrode E to the sub-emitter electrode SE.

As shown in FIG. 2, the p⁺-type substrate 10 has a metallized layer 50 formed on the bottom or rear surface thereof, and is mounted on an island 52, which forms a part of a lead frame, using the metallized layer 50. Namely, the semiconductor device is mounted on the island 52 of the lead frame, so as to be produced as an electronic resin-sealed package.

With the aforesaid arrangement of the semiconductor device, the n⁺-type emitter region 20 is electrically connected to the p⁺-type substrate 10 through the intermediary of the second polycrystalline silicon layer 36, the barrier metal layer 46, the emitter electrode E, the third conducting path P3, the sub-emitter electrode SE, and the p⁺-type sub-emitter region 26. The p⁺-type substrate 10 is electrically connected to the island 52 of the lead frame through the intermediary of the metallized layer 50, and is grounded when being used. Namely, the electrical connection of the emitter electrode E to the p⁺-type substrate 10 is established in an interior of the semiconductor device without using any bonding-wire, for the grounding of the n⁺-type emitter region 20.

Therefore, it is possible to considerably suppress an increase of impedance and a voltage drop, in comparison with a case where a bonding-wire is used to establish the electrical connection for the emitter electrode. Thus, in the semiconductor device according to the present invention, it is possible to considerably improve a high-frequency characteristic and gain.

On the other hand, the collector-bonding pad CP is electrically connected to a lead of the aforesaid lead frame with a bonding-wire, and thus the n⁺-type collector-buried region 14 is electrically connected to that lead through the intermediary of the n⁺-type collector-contact regions 22, the barrier metal layers 42, the collector electrodes C, the first conducting path P1, the collector-bonding pad CP, and the bonding-wire.

Similarly, the base-bonding pad BP is electrically connected to another lead of the aforesaid lead frame with a bonding-wire, and thus the p-type base region 18 is electrically connected to that lead through the intermediary of the first polycrystalline silicon layer 30, the barrier metal layers 44, the base electrodes B, the second conducting path P2, the base-bonding pad BP, and the bonding-wire.

As is apparent from FIGS. 1 and 2, in the first embodiment of the semiconductor device according to the present invention, the p⁺-type sub-emitter region 26 is widely extended so as to encompass the base-bonding pad BP, and is electrically connected to the p⁺-type substrate 10 through the intermediary of the p⁺-type diffusion buried region 24. Thus, although thermal noises are generated in the high resistance n⁻-type epitaxial layer 12 and p⁻-type epitaxial layer 16, and although a parasitic capacitance is produced due to the first, second, and fourth insulation layers 28, 38, and 40 which serve as a dielectric under the base-bonding pad BP, these thermal noises are prevented from being input to the base-bonding pad BP, because the thermal noises can escape to the ground through the p⁺-type sub-emitter layer 26 and the p⁺-type diffusion buried region 24, whereby a noise factor (NF) characteristic can be considerably improved.

In FIG. 1, of course, although the elements of the semiconductor device are illustrated on a larger scale, the scale of the electrodes C, B, E, and SE is considerably different from that of both the collector-bonding pad CP and the base-bonding pad BP, for the sake of convenience of illustration. Namely, if the collector-bonding pad CP and the base-bonding pad BP are illustrated on the same scale as the electrodes C, B, E, and SE, these bonding pads CP and BP must have a larger scale. Incidentally, when each of the electrodes C, B, E, and SE has a width of 0.3 to 0.5 μm and a length of 5 to 20 μm, each of the bonding pad CP and BP has a diameter more than 50 μm. Thus, it is very significant to prevent the inputting of thermal noise from the epitaxial layers 12 and 16 to the base-bonding pad BP for the purpose of the improvement of the NF characteristic.

With reference to FIGS. 4 to 24, a production method of the above-mentioned semiconductor device is explained below by way of example.

Figure 4:
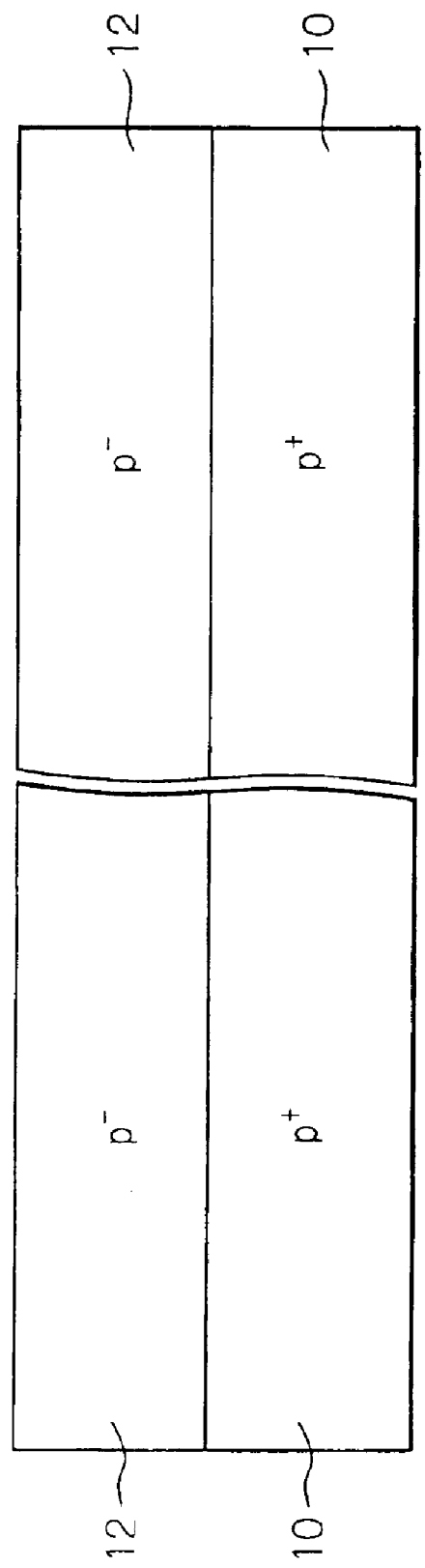
FIG. 4 is a cross-sectional view, corresponding to FIG. 2, showing a first representative step of the production method according to the present invention to produce the semiconductor device shown in FIGS. 1 and 2.

As shown in FIG. 4, first, the p⁻-type epitaxial layer 12 is formed on the p⁺-type substrate 10, using an epitaxial growth method. Note, although not illustrated in FIG. 4, in the production method, the p⁺-type substrate 10 exists as one of p⁺-type diffusion layers formed on a silicon wafer, and, in reality, the production method according to the present invention is carried out by processing the silicon wafer. For example, the p⁺-type substrate 10 may have a specific resistance ρ of 0.01 to 0.1 Ωcm. Also, the p⁻-type epitaxial layer 12 contains an additive of boron (B) so as to have a specific resistance ρ of 5 to 30 Ωcm, and has a thickness of 2 to 15 μm.

Figure 5:
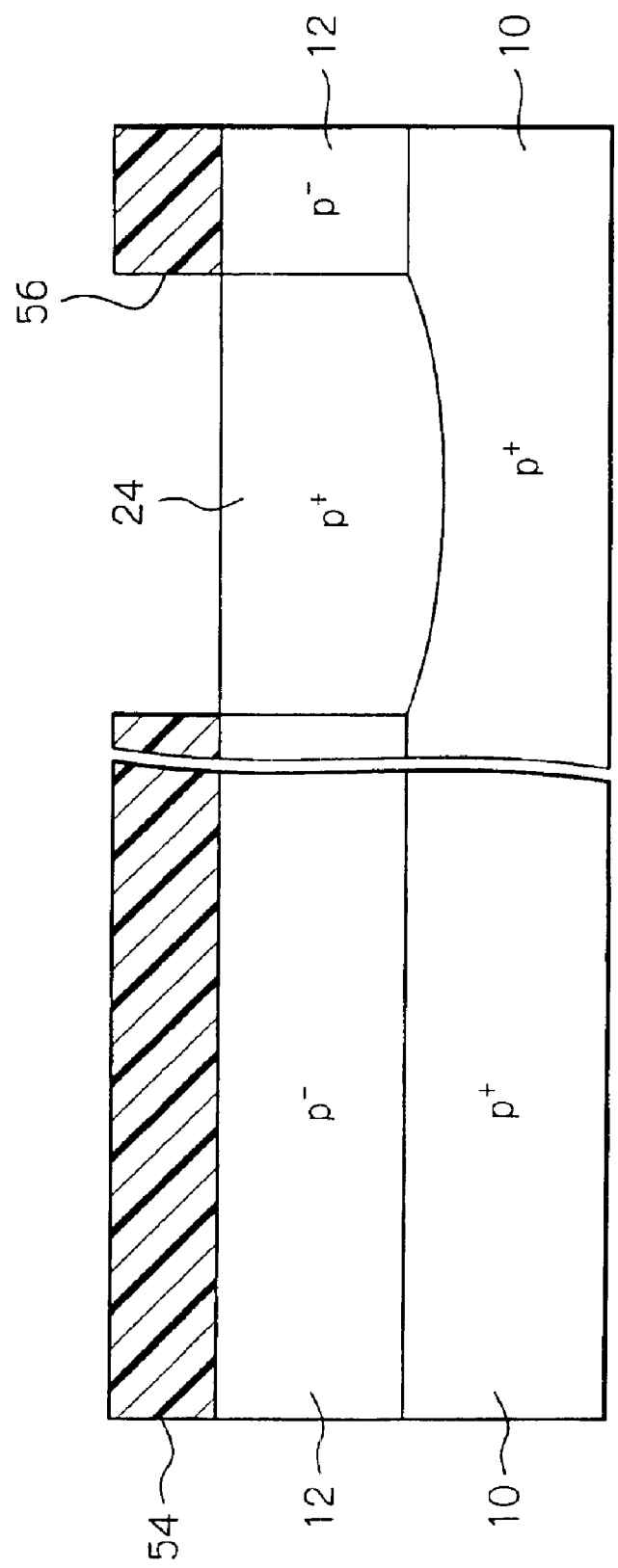
FIG. 5 is a cross-sectional view, corresponding to FIG. 2, showing a second representative step of the production method according to the present invention.

As shown in FIG. 5, a photoresist layer 54 is formed on the p⁻-type epitaxial layer 12, and an opening 56, corresponding to the high concentration/low resistance p⁺-type diffusion buried region 24, is perforated in the photoresist layer 54, using a photolithography process and an etching process. Then, boron ions (B⁺) are implanted in the p⁻-type epitaxial layer 12 through the opening 56, and the p⁺-type substrate 10, the p⁻-type epitaxial layer 12, and the photoresist layer 54 are subjected to an annealing process at a temperature of more than 1100° C., whereby the p⁺-type diffusion buried region 24 is produced and formed in the p⁻-type epitaxial layer 12. The p⁺-type diffusion buried region 24 has a depth reaching the p⁺-type substrate 10. Note, for example, in the p⁺-type diffusion buried region 24, the density of boron may be 1E18 cm⁻³.

Figure 6:
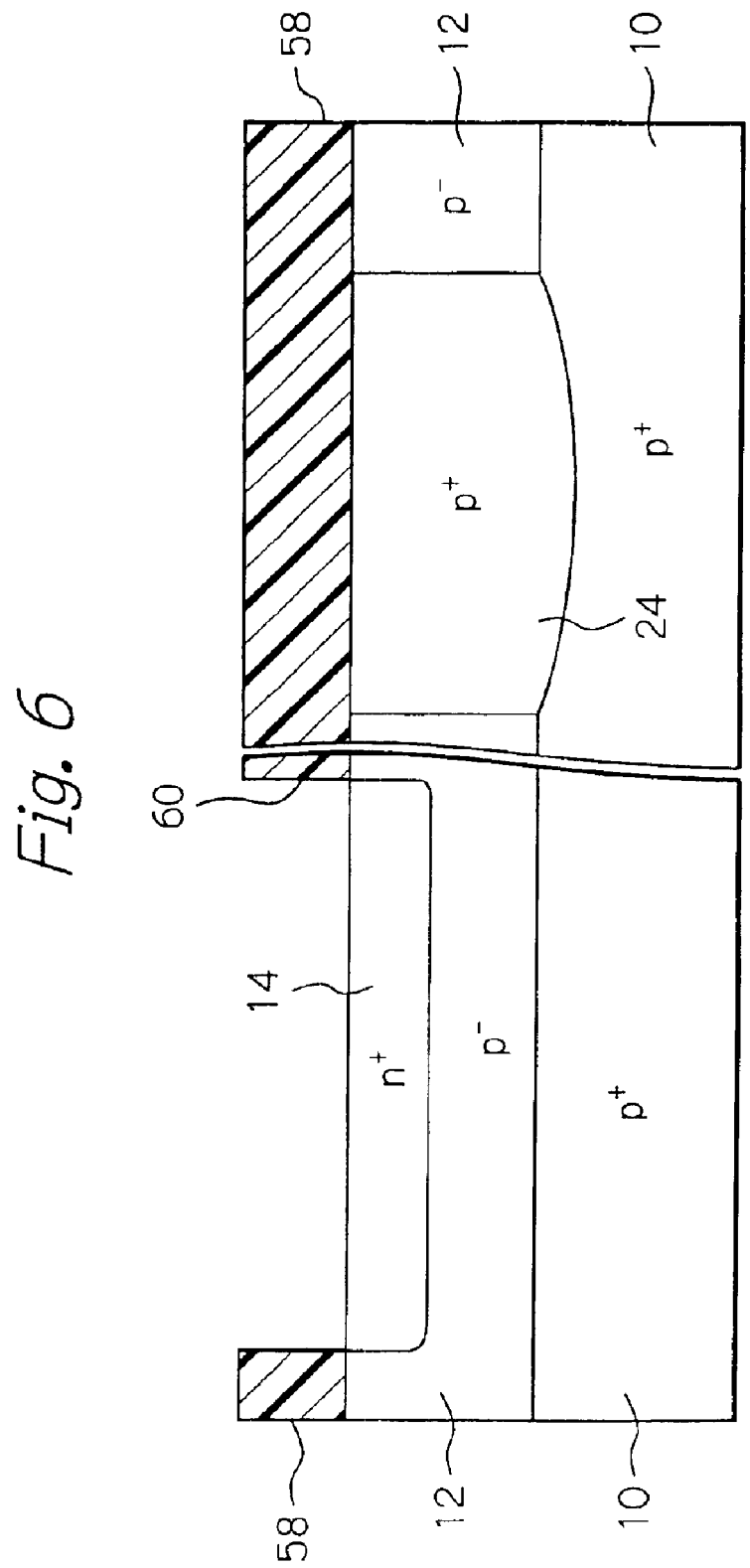
FIG. 6 is a cross-sectional view, corresponding to FIG. 2, showing a third representative step of the production method according to the present invention.

After the formation of the p⁺-type diffusion buried region 24, the photoresist layer 54 is removed from the p⁻-type epitaxial layer 12. Next, as shown in FIG. 6, a photoresist layer 58 is again formed on the p⁻-type epitaxial layer 12, and an opening 60, corresponding to the high concentration/low resistance n⁺-type collector-buried region 14, is perforated in the photoresist layer 58, using a photolithography process and an etching process. Then, arsenic ions (As⁺) are implanted in the p⁻-type epitaxial layer 12 through the opening 60, and the p⁺-type substrate 10, the p⁻-type epitaxial layer 12, and the photoresist layer 58 are subjected to an annealing process, whereby the n⁺-type collector-buried region 14 is produced and formed in the p⁻-type epitaxial layer 12. For example, the n⁺-type collector-buried layer 14 may have a sheet resistance ρs of 10 to 30 Ω/□.

Figure 7:
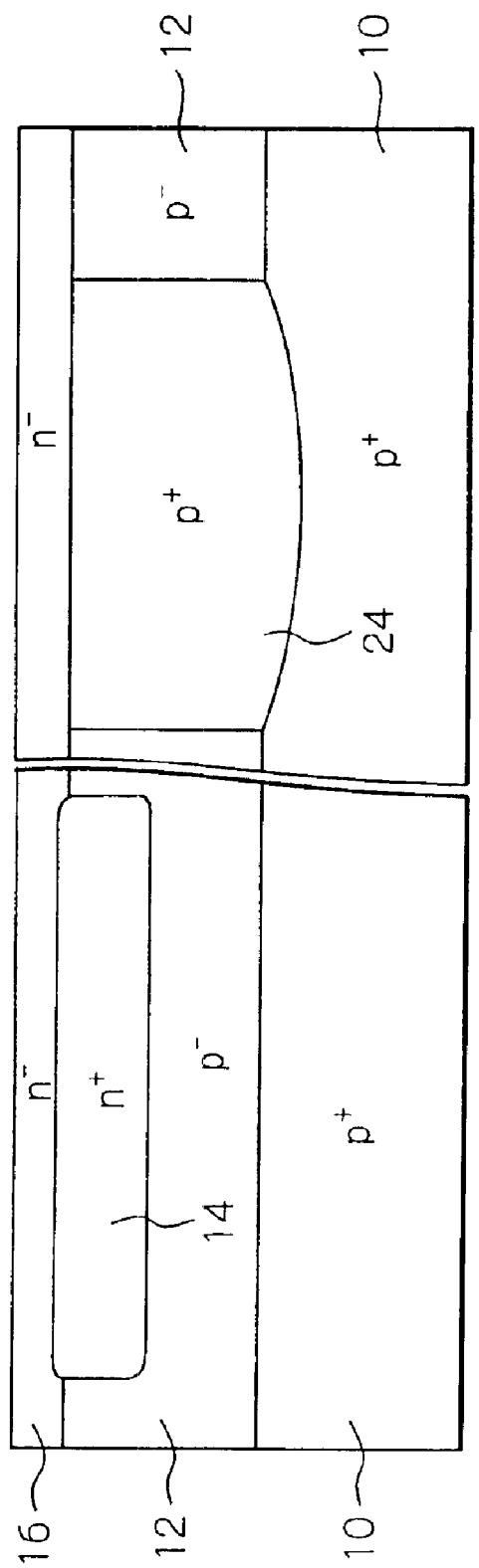
FIG. 7 is a cross-sectional view, corresponding to FIG. 2, showing a fourth representative step of the production method according to the present invention.

After the formation of the n⁺-type collector-buried region 14, the photoresist layer 58 is removed from the p⁻-type epitaxial layer 12. Then, as shown in FIG. 7, the n⁻-type epitaxial layer 16 containing an additive of phosphorus (P) is formed on the p⁻-type epitaxial layer 12. For example, the n⁻-type epitaxial layer 16 has a specific resistance ρ of 0.5 to 4 Ωcm, and a thickness of 0.5 to 5 μm.

Figure 8:
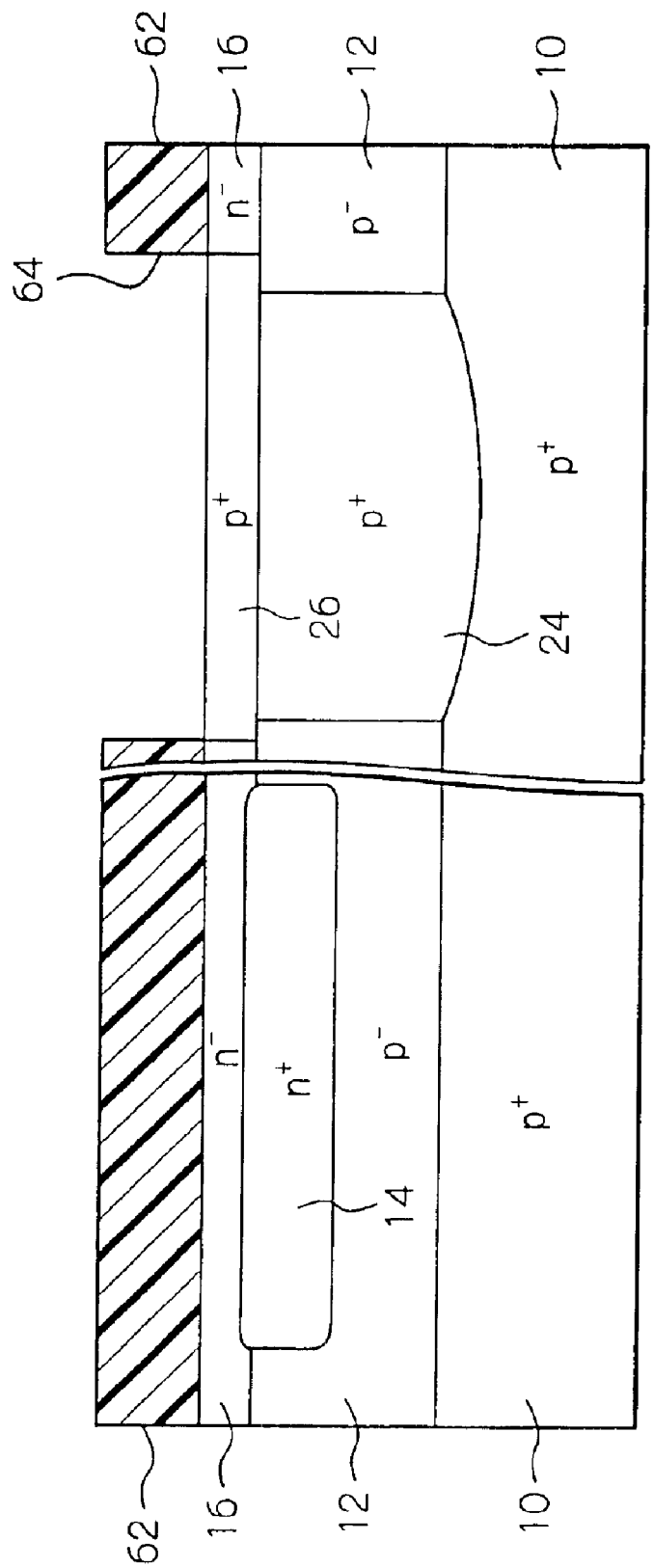
FIG. 8 is a cross-sectional view, corresponding to FIG. 2, showing a fifth representative step of the production method according to the present invention.

Subsequently, as shown in FIG. 8, a photoresist layer 62 is formed on the n⁻-type epitaxial layer 16, and an opening 64, corresponding to the high concentration/low resistance p⁺-type sub-emitter region 26, is perforated in the photoresist layer 54, using a photolithography process and an etching process. Then, boron ions (B⁺) are implanted in the n⁻-type epitaxial layer 16 through the opening 64, and the p⁺-type substrate 10, the p⁻-type epitaxial layer 12, the n⁻-type epitaxial layer 16, and the photoresist layer 62 are subjected to an annealing process at a temperature of more than 900° C., whereby the p⁺-type sub-emitter region 26 is produced and formed in the n⁻-type epitaxial layer 16. The p⁺-type sub-emitter region 26 has a depth reaching the p⁺-type diffusion buried region 24. Note, for example, in the p⁺-type sub-emitter region 26, the density of boron may be 1E18 cm⁻³. Also, note, as is apparent from FIG. 8, the p⁺-type sub-emitter region 26 has a somewhat larger area than that of the p⁺-type diffusion buried region 24.

Figure 9:
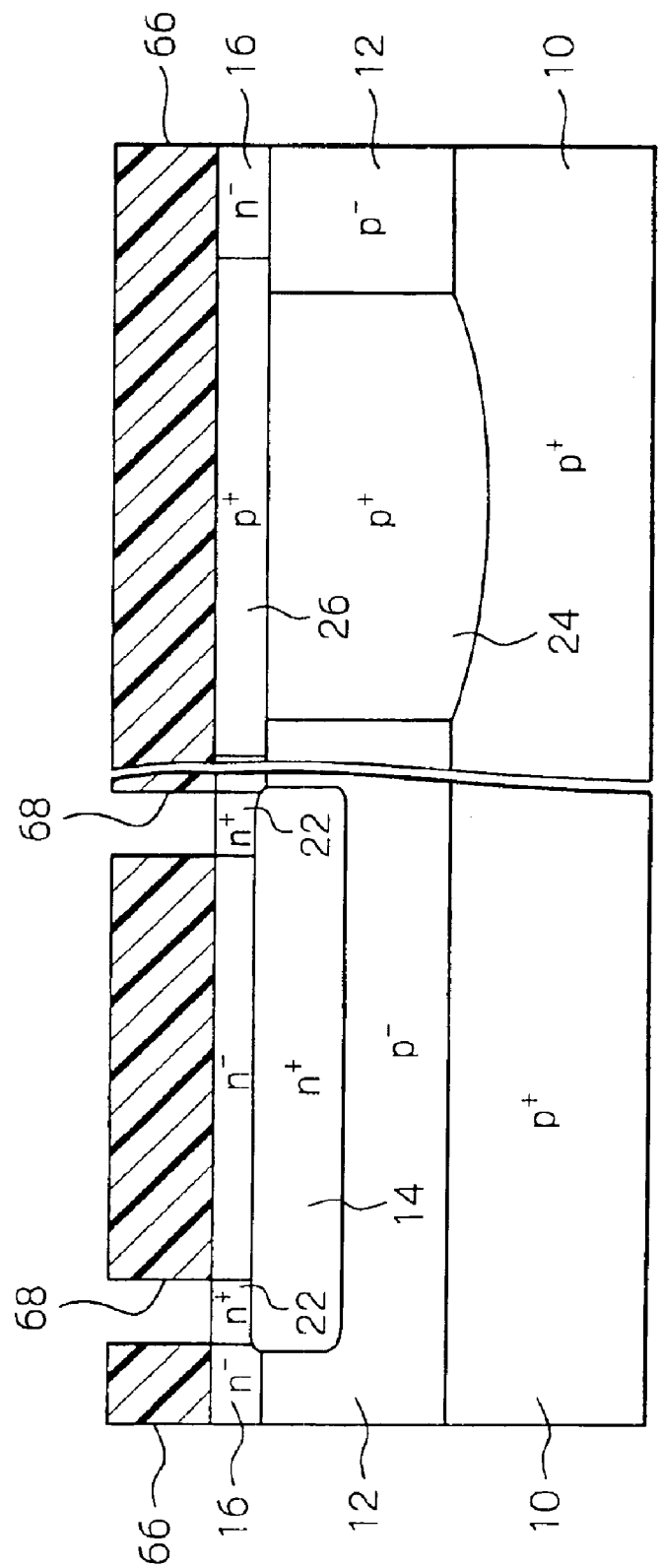
FIG. 9 is a cross-sectional view, corresponding to FIG. 2, showing a sixth representative step of the production method according to the present invention.

After the formation of the p⁺-type sub-emitter region 26, the photoresist layer 62 is removed from the n⁻-type epitaxial layer 16. Next, as shown in FIG. 9, a photoresist layer 66 is again formed on the n⁻-type epitaxial layer 16, and a pair of openings 68, corresponding to the pair of n⁺-type collector-contact regions 22, are perforated in the photoresist layer 66, using a photolithography process and an etching process. Then, phosphorus ions (P⁺) are implanted in the n⁻-type epitaxial layer 16 through the openings 68, and the p⁺-type substrate 10, the p⁻-type epitaxial layer 12, the n⁻-type epitaxial layer 16, and the photoresist layer 66 are subjected to an annealing process, whereby the pair of n⁺-type collector-contact regions 22 are formed in the n⁻-type epitaxial layer 16. Each of the n⁺-type collector-contact regions 22 has a depth reaching the n⁺-type collector-buried layer 14. Also, each of the n⁺-type collector-contact layers 22 may have a specific resistance, which is equivalent to that of the n⁺-type collector-buried layer 14.

Figure 10:
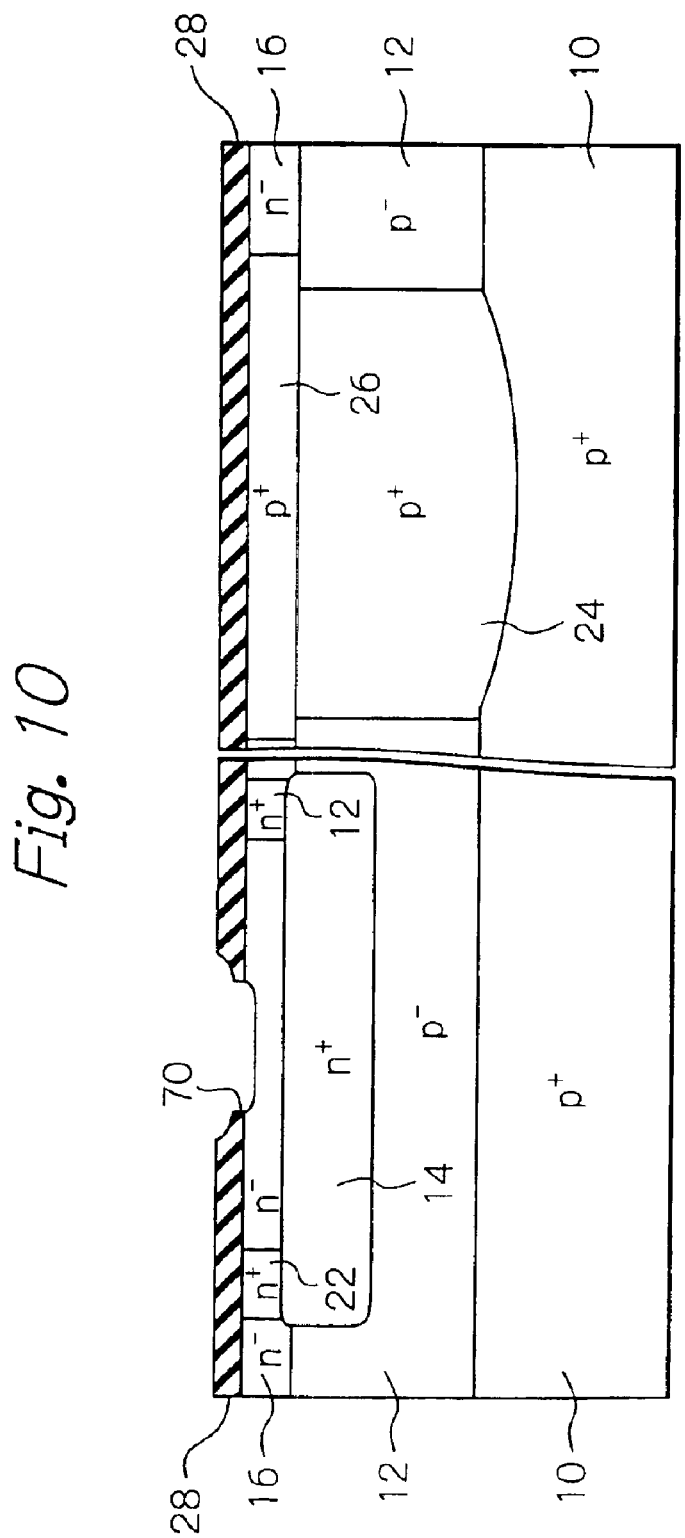
FIG. 10 is a cross-sectional view, corresponding to FIG. 2, showing a seventh representative step of the production method according to the present invention.
Figure 11:
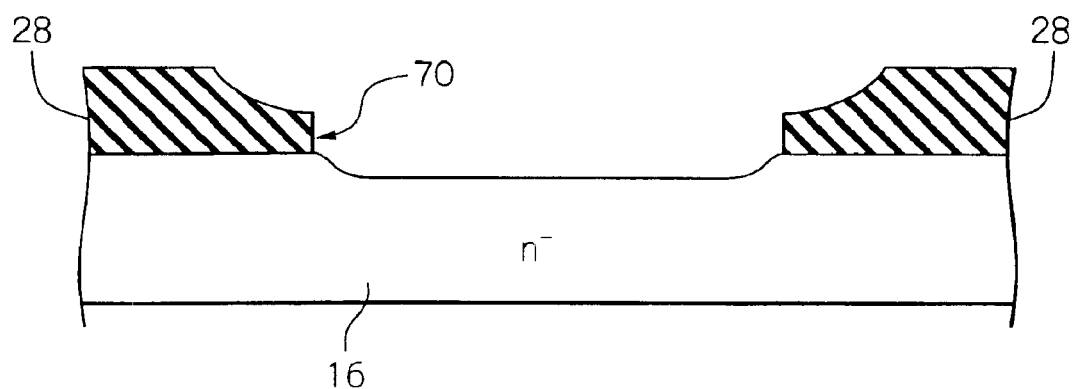
FIG. 11 is a partially-enlarged view of FIG. 10.
Figure 12:
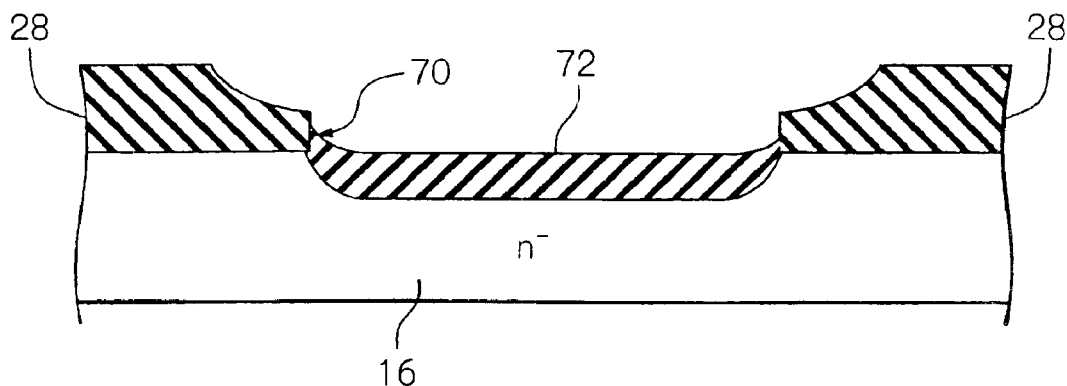
FIG. 12 is a partially-enlarged view, corresponding to FIG. 11, showing an eighth representative step of the production method according to the present invention.

After the formation of the n⁺-type collector-contact regions 22, the photoresist layer 66 is removed from the n⁻-type epitaxial layer 16. Next, as shown in FIG. 10, the first insulation layer 28 is deposited as a silicon dioxide layer on the n⁻-type epitaxial layer 16, using, for example, a CVD method. Note, a thermal oxidation method may be used for the formation of the first insulation layer 28. Then, using a photolithography process and an etching process, an opening 70 is perforated in the first insulation layer 28 at a base-formation area thereof, which is defined above the n⁺-type collector-buried region 14. Namely, as best shown in FIG. 11, the n⁻-type epitaxial layer 16 is partially exposed to the outside, and the partially-exposed area of the n⁻-type epitaxial layer 16 is shallowly etched in the etching process. Subsequently, as shown in FIG. 12, a thin silicon dioxide layer 72 is formed on the partially exposed area of the n⁻-type epitaxial layer 16, using a thermal oxidation method, so as to be is integrated with the first silicon dioxide layer 28.

Figure 13:
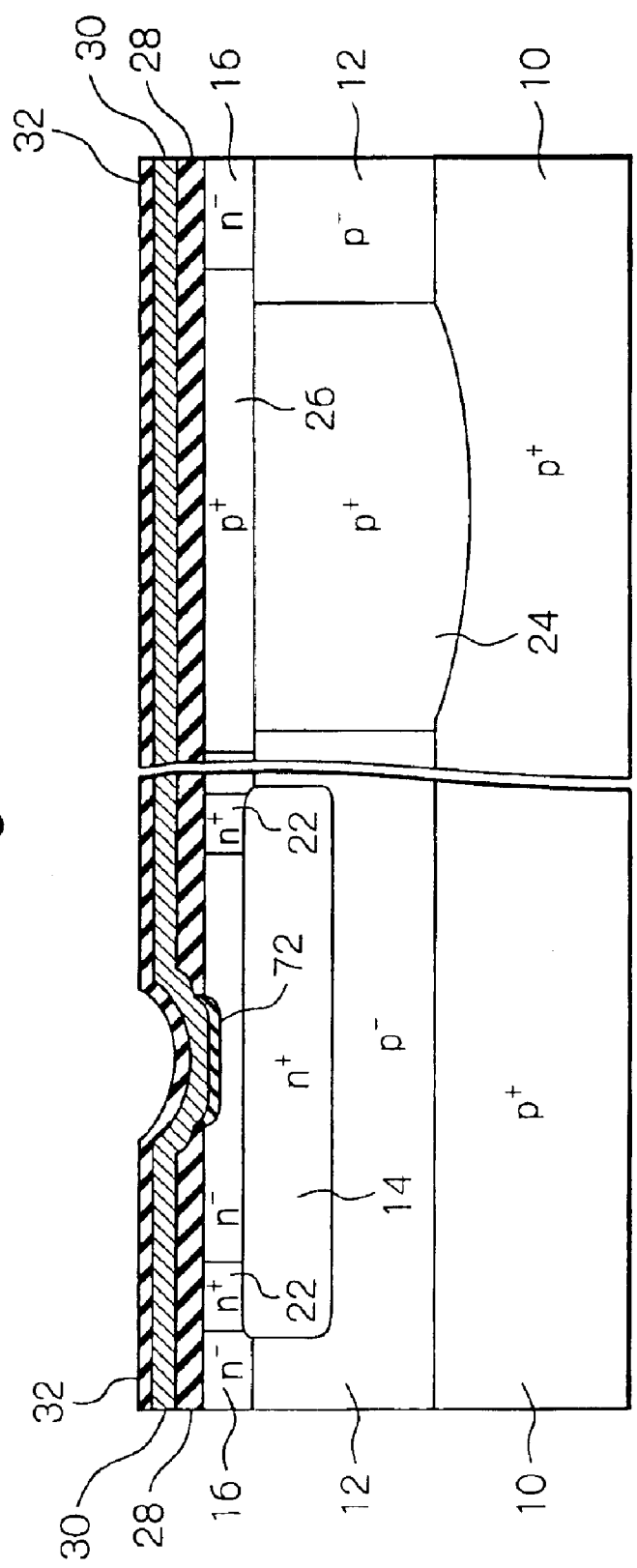
FIG. 13 is a cross-sectional view, corresponding to FIG. 2, showing a ninth representative step of the production method according to the present invention.
Figure 14:
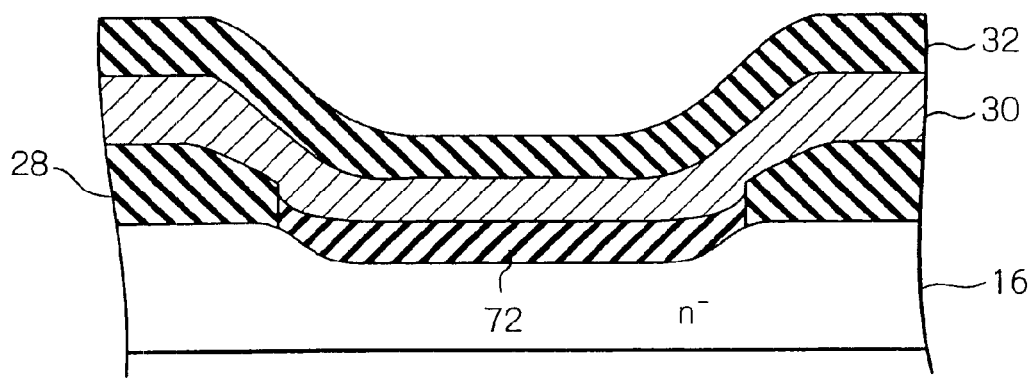
FIG. 14 is a partially-enlarged view of FIG. 13.
Figure 15:
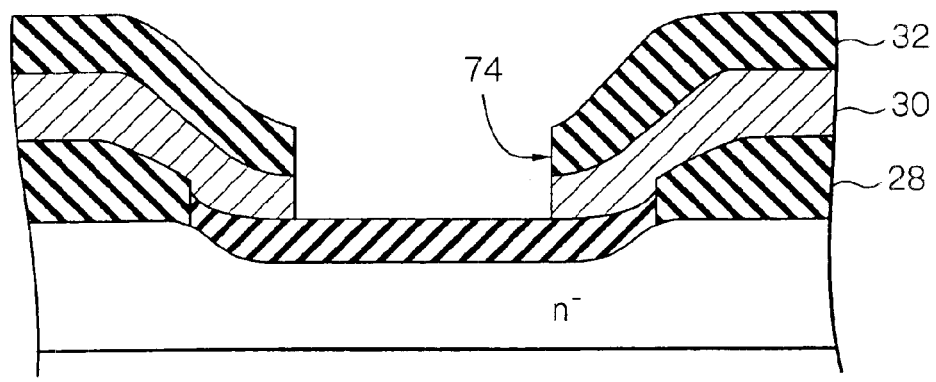
FIG. 15 is a partially-enlarged view, corresponding to FIG. 14, showing a tenth representative step of the production method according to the present invention.

Thereafter, as shown in FIGS. 13 and 14, the first polycrystalline silicon layer 30 is formed on the first insulation layer 28 including the thin silicon dioxide layer 72. In this embodiment, the first polycrystalline silicon layer 30 contains an additive of boron (B), and has a predetermined thickness. Subsequently, the second insulation layer 32 is deposited as a silicon dioxide layer on the first polycrystalline silicon layer 30, using a CVD method. Then, as shown in FIG. 15, an opening 74, having a smaller size than the aforesaid opening 70, is perforated in both the first polycrystalline silicon layer 30 and the second insulation layer 32, using a photolithography process and an etching process.

Figure 16:
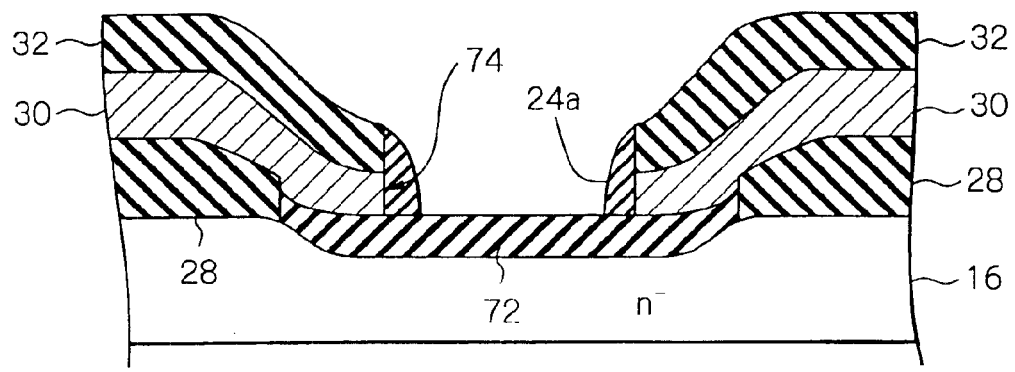
FIG. 16 is a partially-enlarged view, corresponding to FIG. 15, showing an eleventh representative step of the production method according to the present invention.
Figure 17:
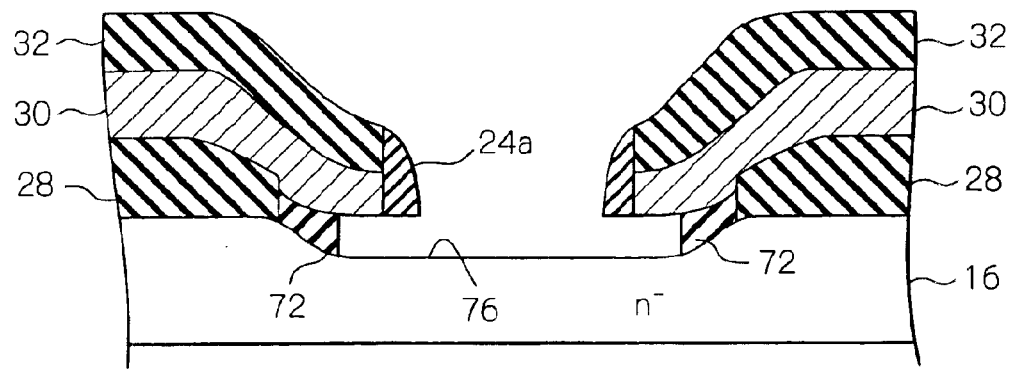
FIG. 17 is a partially-enlarged view, corresponding to FIG. 16, showing a twelfth representative step of the production method according to the present invention.

After the perforation of the opening 74, an additional insulation layer is deposited as a silicon nitride layer on the second insulation layer 32 including the opening 74, and is subjected to an anisotropic etching process, such that a part of the silicon nitride layer is left as the first side wall 34a along an inner peripheral wall of the opening 74, as shown in FIG. 16. Then, the thin silicon dioxide layer 72 is etched such that a recess 76 is formed, as shown in FIG. 17. Namely, due to the formation of the recess 76, a part of the n⁻-type epitaxial layer 16 and a part of the first polycrystalline silicon layer 30 are exposed.

Figure 18:
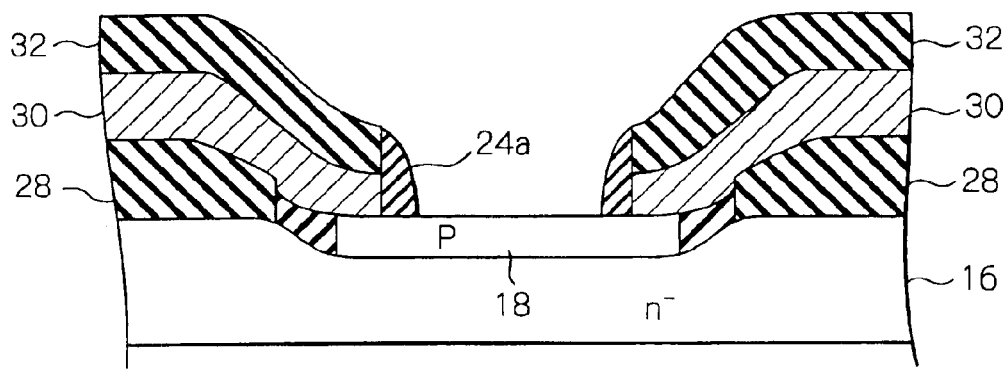
FIG. 18 is a partially-enlarged view, corresponding to FIG. 17, showing a thirteenth representative step of the production method according to the present invention.
Figure 19:
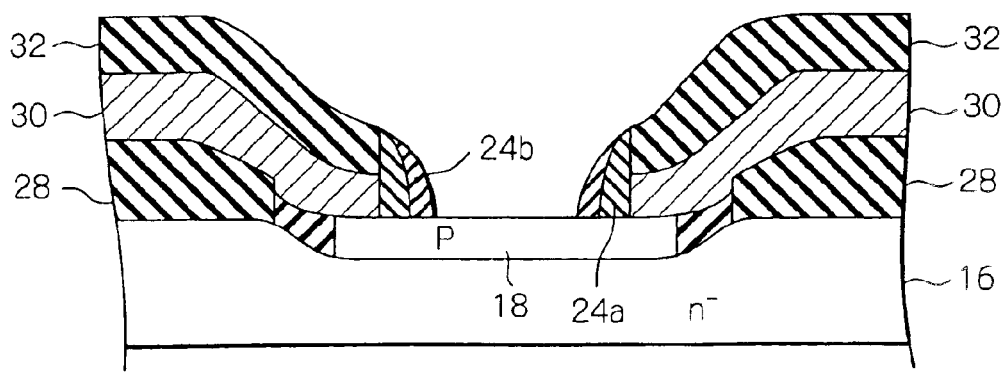
FIG. 19 is a partially-enlarged view, corresponding to FIG. 18, showing a fourteenth representative step of the production method according to the present invention.

After the formation of the recess 76 in the thin silicon dioxide layer 72, as shown in FIG. 18, the p-type base region 18 is formed as a silicon/germanium (SiGe) epitaxial region on the exposed part of the n⁻-type epitaxial layer 16, using a selective epitaxial growth process, with the SiGe epitaxial region containing an additive of boron (B). Note, as best shown in FIG. 18, the p-type base region 18 is in electrical contact with the exposed part of the first polycrystalline silicon layer 30. Thereafter, an additional insulation layer is deposited as a silicon dioxide layer on the second insulation layer 32 including the exposed area of the p-type base region 18, and is subjected to an anisotropic etching process, such that a part of the silicon dioxide layer is left as the second side wall 24b along the first side wall 24a, as shown in FIG. 19.

Figure 20:
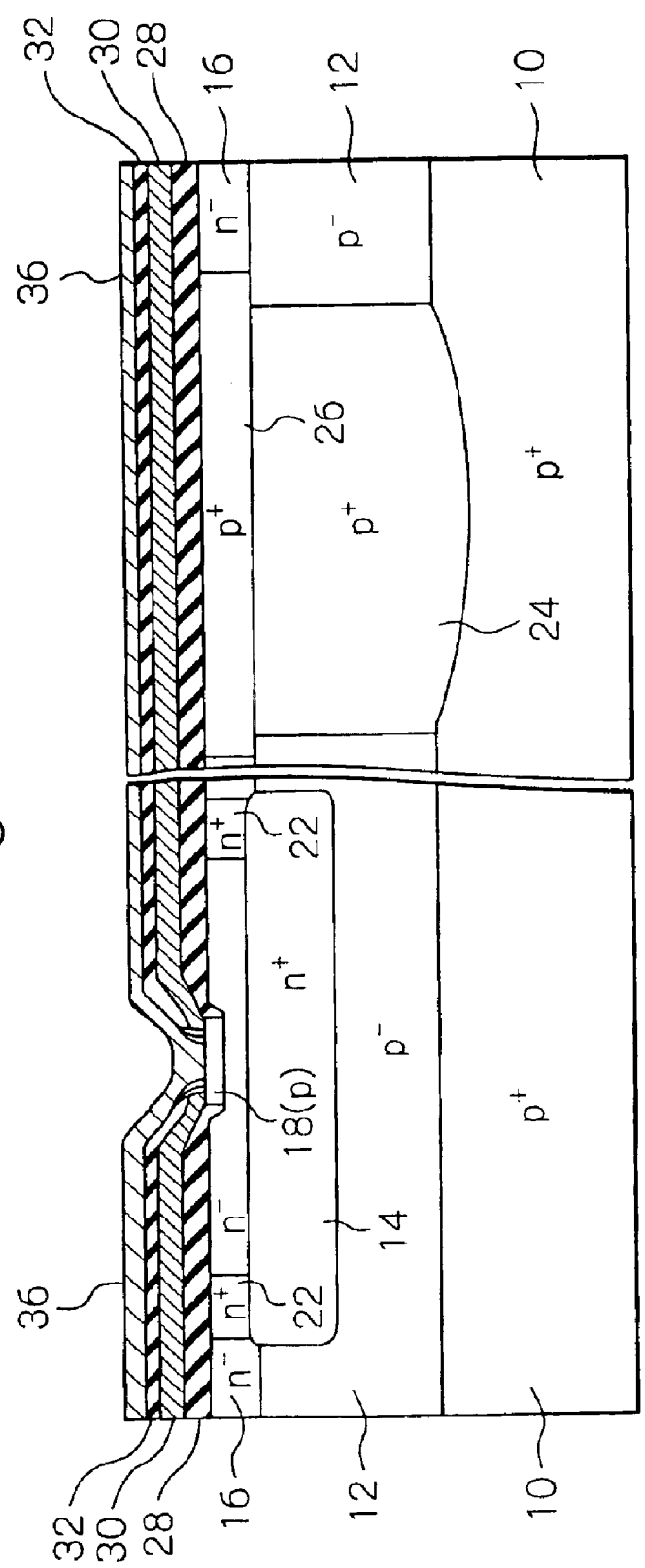
FIG. 20 is a cross-sectional view, corresponding to FIG. 2, showing a fifteenth representative step of the production method according to the present invention.
Figure 21:
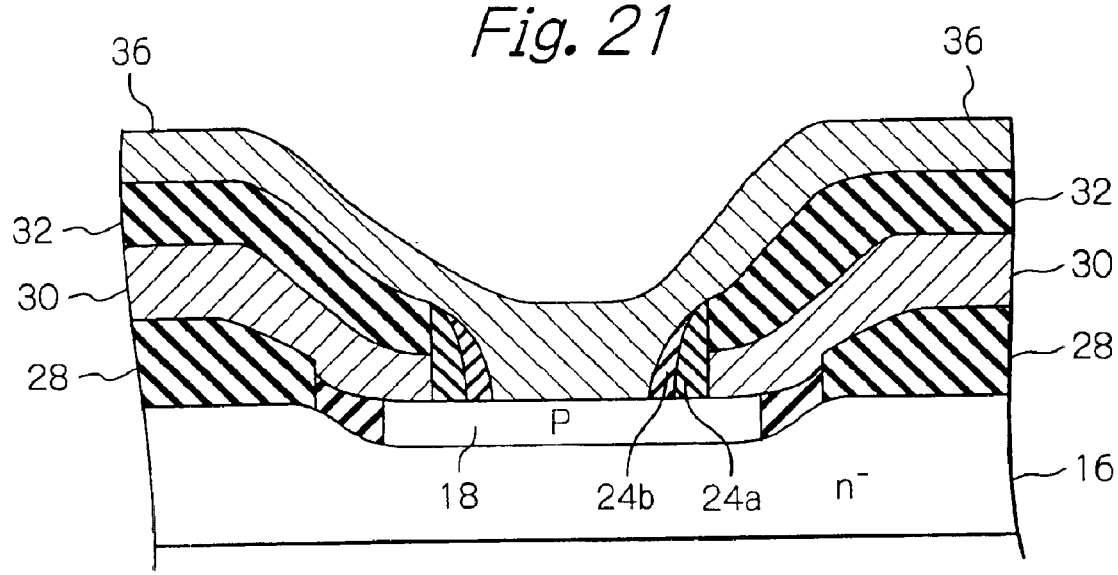
FIG. 21 is a partially-enlarged view of FIG. 20.
Figure 22:
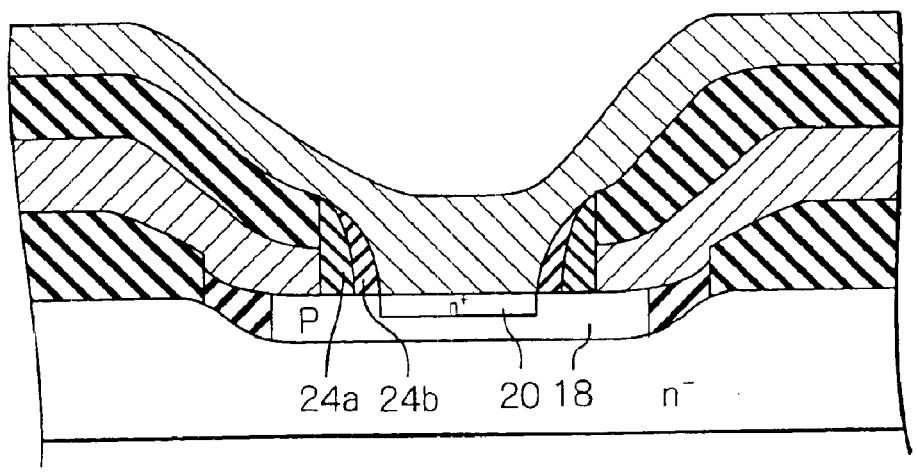
FIG. 22 is a partially-enlarged view, corresponding to FIG. 21, showing a sixteenth representative step of the production method according to the present invention.

Thereafter, as shown in FIGS. 20 and 21, the second polycrystalline silicon layer 36 is formed on the second insulation layer 32 including the exposed area of the p-type base region 18. Then, arsenic ions (As⁺) are implanted in the area of the p-type base region 18, surrounded by the second side wall 24b, through the second polycrystalline silicon layer 36, and thus the n⁺-type emitter region 20 is produced and formed in the p-type base region 18, as shown in FIG. 22.

Figure 23:
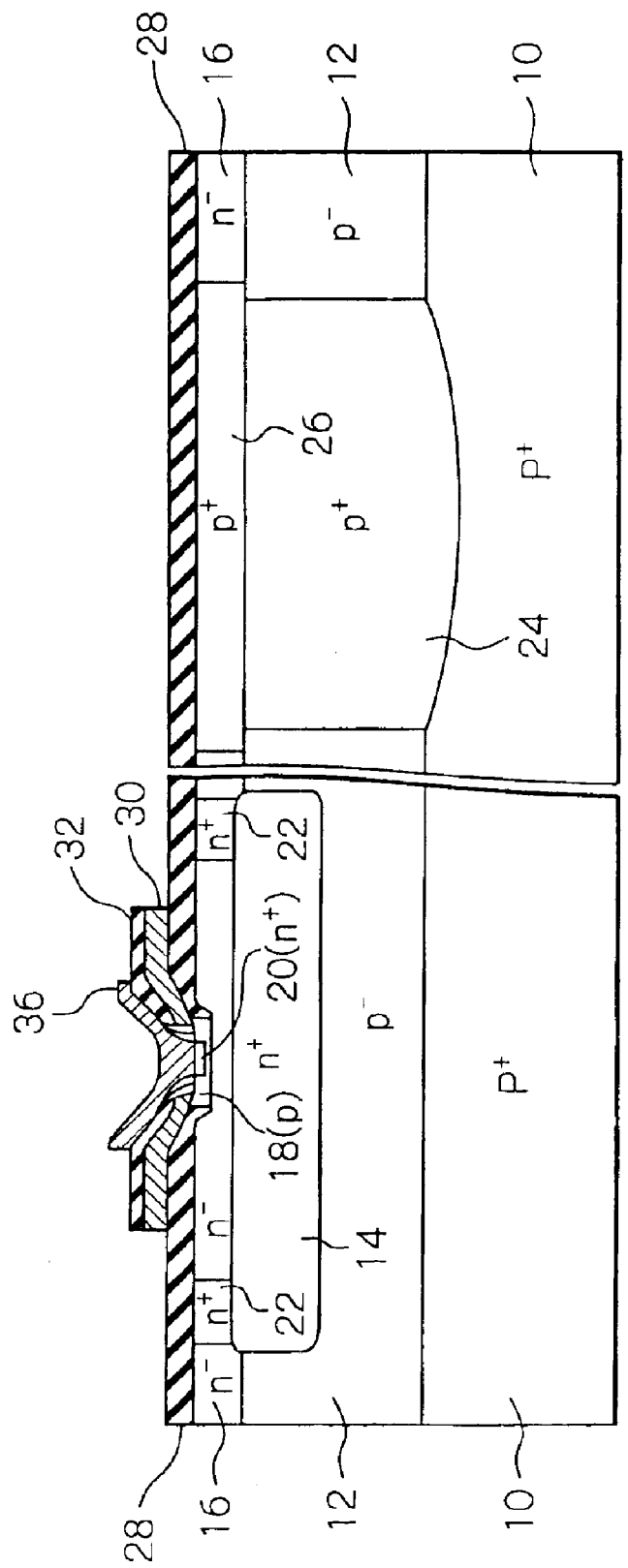
FIG. 23 is a cross-sectional view, corresponding to FIG. 2, showing a seventeenth representative step of the production method according to the present invention.

After the formation of the n⁺-type emitter region 20 in the p-type base region 18, the second polycrystalline silicon layer 36 is etched and shaped as shown in FIG. 23, using a photolithography process and an etching process. Namely, a part of the second polycrystalline silicon layer 36 is left on the second insulation layer 32 so as to cover the p-type base region 18 and the n⁺-type emitter region 20. Then, both the second insulation layer 32 and the first polycrystalline silicon layer 30 are etched and shaped as shown in FIG. 23, using a photolithography process and an etching process. Namely, a part of both the layers 32 and 30 is left on the first insulation layer 28 so as to have a larger area than that of the left part of the second polycrystalline layer 38.

Figure 24:
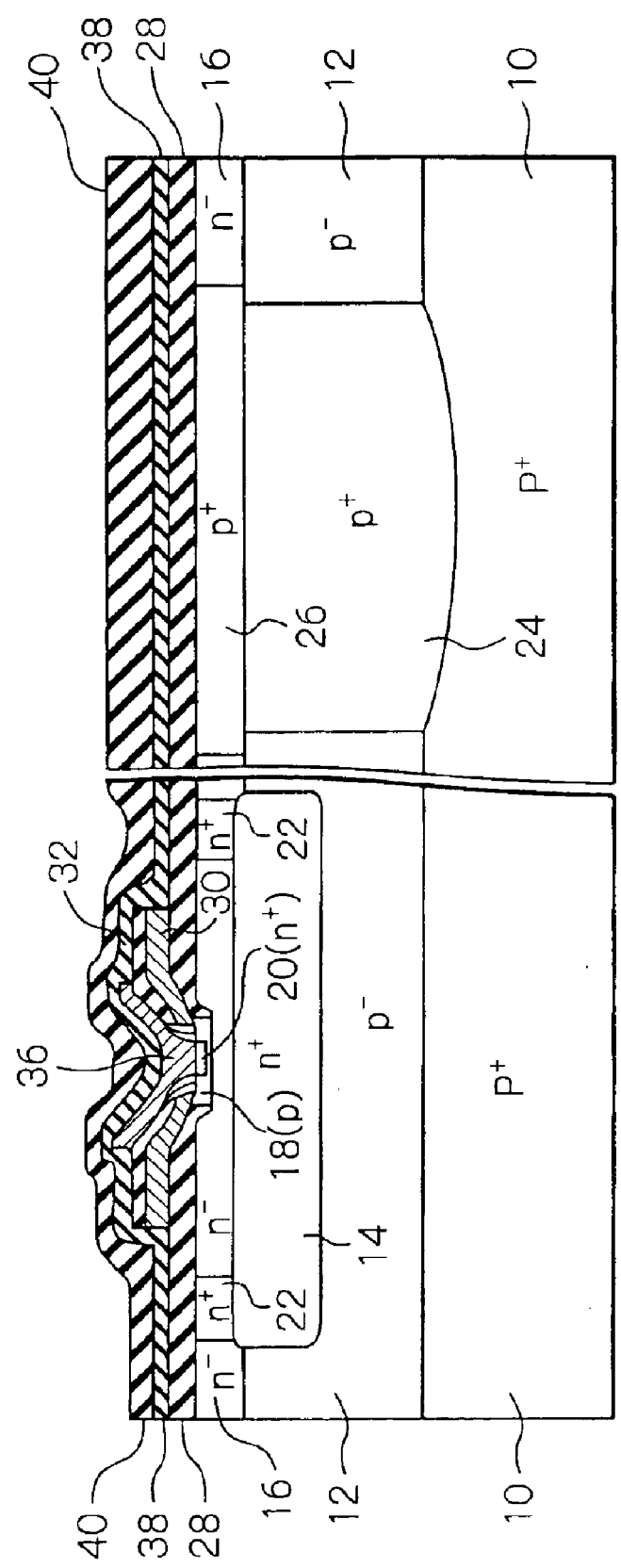
FIG. 24 is a cross-sectional view, corresponding to FIG. 2, showing an eighteenth representative step of the production method according to the present invention.

Subsequently, as shown in FIG. 24, the third insulation layer 38 is deposited as a silicon dioxide layer on the first insulation layer 28 with the shaped layers 30, 32, and 36, using a CVD method, and the fourth insulation layer 40 is further deposited on the third insulation layer 38 for a flatness of the top surface thereof.

Thereafter, as already explained with reference to FIGS. 1, 2 and 3, the electrodes C, B, E and SE, and the pads CP and BP are formed, and then the wiring pattern including the conducting paths P1, P2, and P3 are formed. Then, as shown in FIG. 2, the metallized layer 50 is formed on the bottom or rear surface of the p⁺-type substrate 10, to thereby produce the semiconductor device according to the present invention, and this semiconductor device (bare chip) is mounted on the island 52 of the lead frame so as to be produced as an electronic resin-sealed package.

In the above-mentioned embodiment, since the base region 18 is formed as the silicon/germanium (SiGe) region, an energy band gap becomes smaller, and a hetero-junction is produced between the p-type base region 18 and the n⁺-type emitter region 20. Due to the emitter-base hetero-junction, an electron-injection efficiency for injecting electrons from the emitter to the base becomes higher, and thus it is possible to make the current gain ($h_{FE}$) higher in comparison with a conventional silicon BJT.

In the conventional silicon BJT, it is impossible to make a base impurity density higher (for example, more than 1E18 cm⁻³), because a decline of the current gain ($h_{FE}$) should be prevented. However, in the aforesaid SiGe-HBT (hetero-junction bipolar transistor), the base impurity density can be made higher without decreasing the current gain ($h_{FE}$). Therefore, in the aforesaid SiGe-HBT, by making the base impurity density higher, a base resistance can become smaller, and thus it is possible to suppress the thermal noise, which depends upon the base resistance.

Incidentally, in the first embodiment, when the aforesaid BJT is operated in the high frequency band from 400 Mhz to 5.5 Ghz, it has been confirmed that the NF characteristic could be improved in a range from 0.1 to 0.3 dB. Also, it has been confirmed that a gain is improved in a range from 2 to 3 dB, in comparison with the conventional BJT in which an emitter electrode is electrically connected to a lead of the lead frame with a bonding wire.

Figure 25:
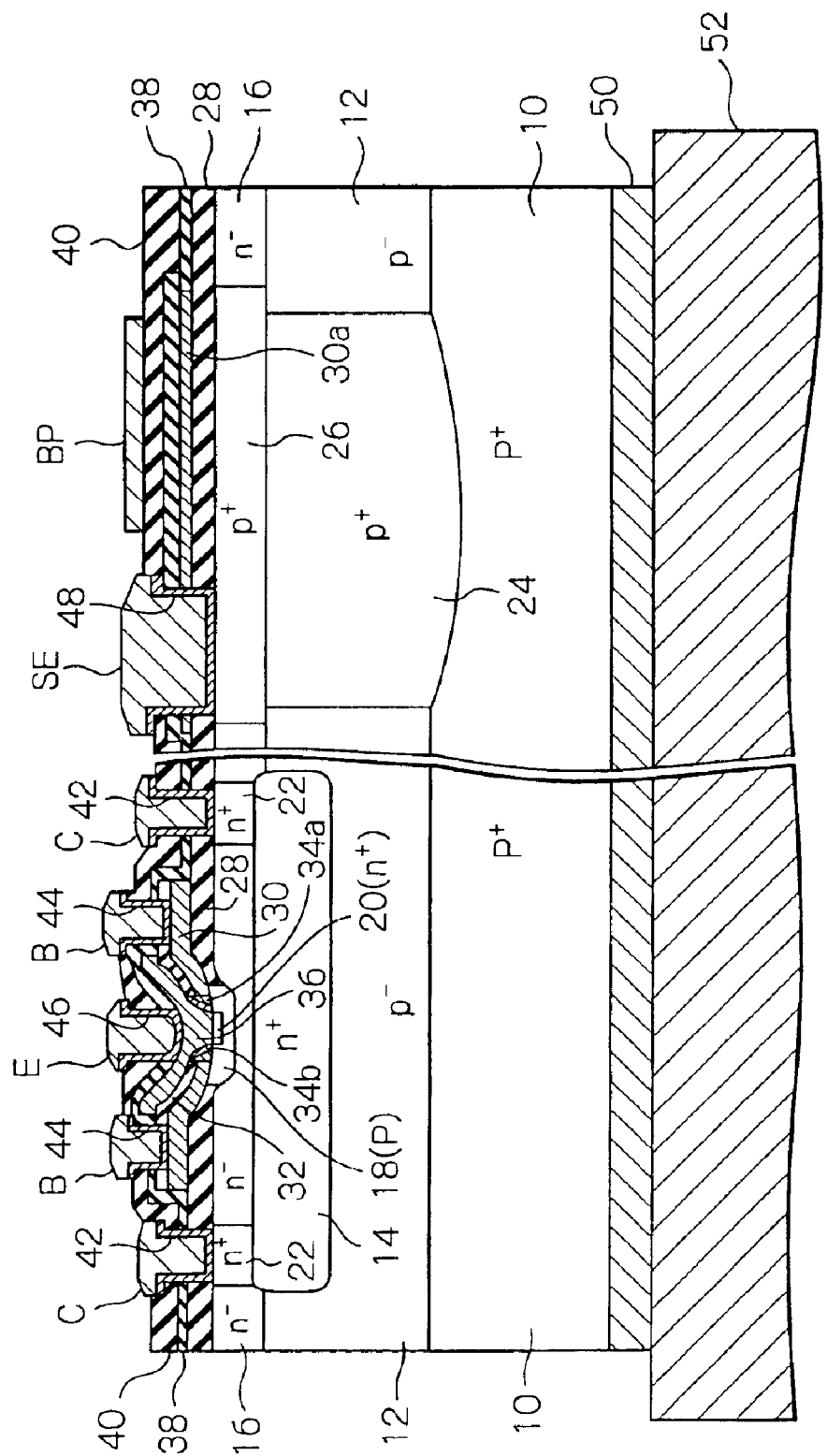
FIG. 25 is a cross-sectional view, corresponding to FIG. 2, showing a second embodiment of the semiconductor device including the bipolar junction transistor according to the present invention.

FIG. 25 shows a second embodiment of the semiconductor device including the bipolar junction transistor (BJT) according to the present invention. Note, in this drawing, the features similar to those of FIG. 2 are indicated by the same references.

In the second embodiment, when a part of the first polycrystalline silicon layer 30 is left on the first insulation layer 28 as shown in FIG. 23, another part 30a of the first polycrystalline silicon layer 30 is left on the first insulation layer 28 as a conductive layer so as to cover the p⁺-type sub-emitter region 26, as shown in FIG. 25, and thus the base-bonding pad BP is encompassed with the left part or conductive layer 30a of the first polycrystalline silicon layer 30.

As is apparent from FIG. 25, the conductive layer 30a is electrically connected to the barrier metal layer 48, and therefore, the sub-emitter electrode SE. Namely, the conductive layer 30a is grounded through the intermediary of the sub-emitter electrode SE, the p⁺-type sub-emitter region 26, the p⁺-type diffusion buried layer 24, the p⁺-type substrate 10, and the metallized layer 50, and thus serves as a grounded shield for the base-bonding pad BP. Accordingly, it is possible to securely prevent the inputting of thermal noise from the epitaxial layers 12 and 16 into the base-bonding pad BP.

Figure 26:
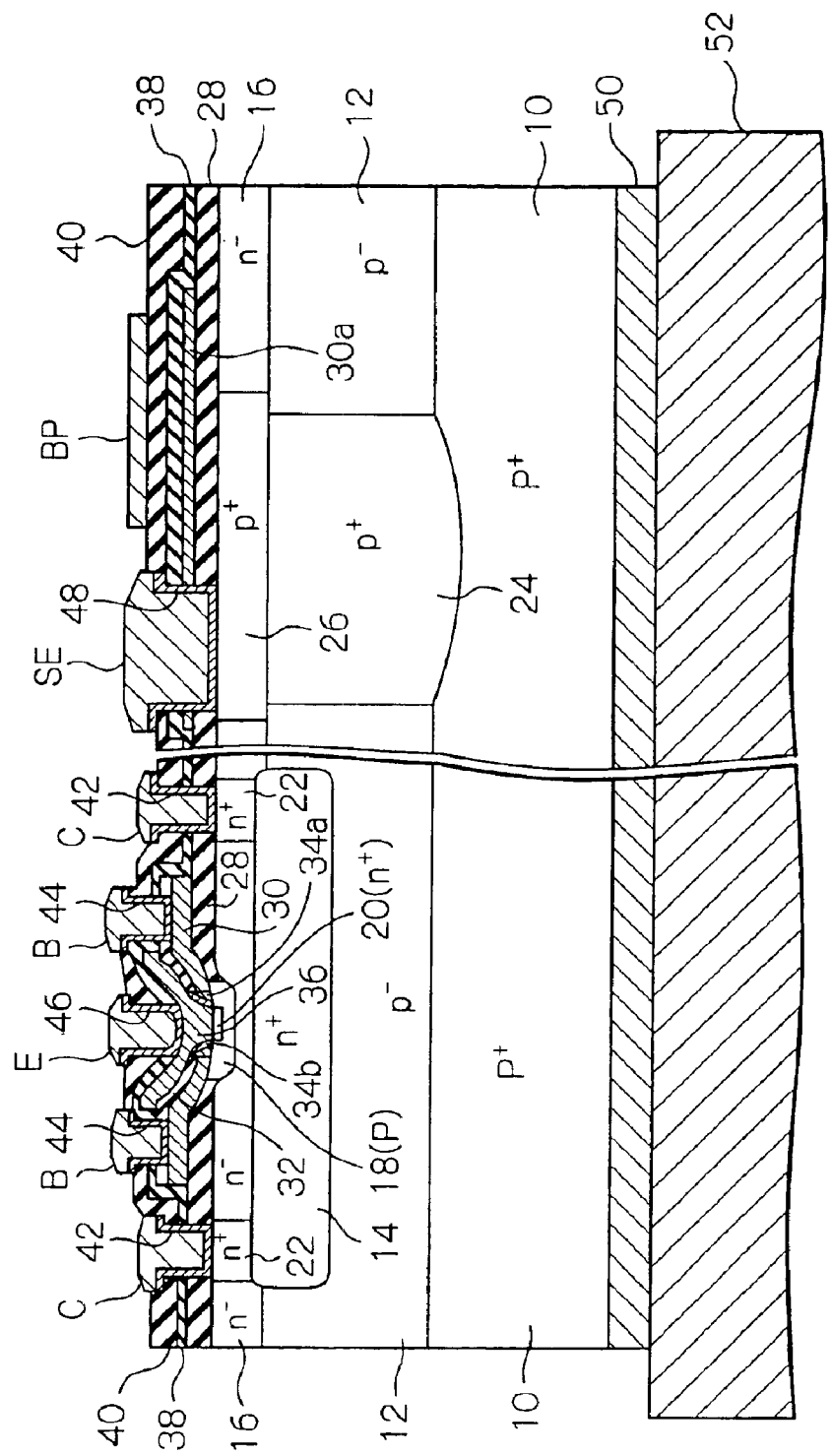
FIG. 26 is a cross-sectional view, similar to FIG. 25, showing a first modification of the second embodiment of the semiconductor device including the bipolar junction transistor according to the present invention.

FIG. 26 shows a first modification of the second embodiment of the semiconductor device including the bipolar junction transistor (BJT) according to the present invention.

In this first modification (shown in FIG. 26), an extent of the p⁺-type sub-emitter region 26 is restricted so that only a part of the base-bonding pad BP is encompassed with the p⁺-type sub-emitter region 26. In contrast, the base-bonding pad BP is shown completely encompassed with the p⁺-type sub-emitter region 26 in FIG. 25. Nevertheless, it is possible to effectively and securely prevent the inputting of the thermal noise from the epitaxial layers 12 and 16 into the base-bonding pad BP, because the base-bonding pad BP is completely encompassed with a conductive layer 30a of the first polycrystalline silicon layer 30.

Figure 27:
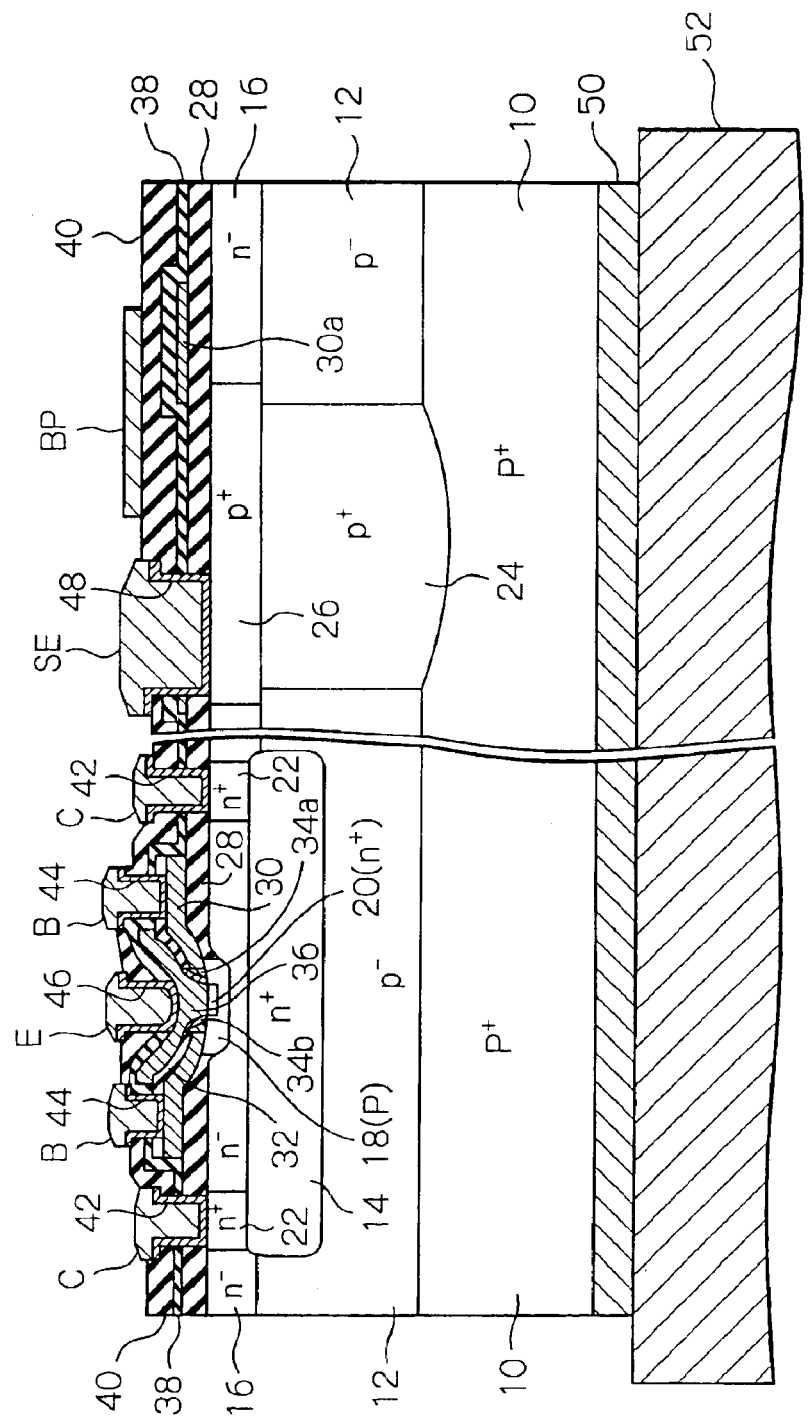
FIG. 27 is a cross-sectional view, similar to FIG. 25, showing a second modification of the second embodiment of the semiconductor device including the bipolar junction transistor according to the present invention.

FIG. 27 shows a second modification of the second embodiment of the semiconductor device including the bipolar junction transistor (BJT) according to the present invention.

Similar to the first modification of FIG. 26, only a part of the base-bonding pad BP is encompassed with the p⁺-type sub-emitter region 26. In the second modification, a conductive layer 30a of the first polycrystalline silicon layer 30 is shaped so as to encompass the remaining part of the base-bonding pad BP, which is not encompassed with the p⁺-type sub-emitter region 26, as shown in FIG. 27. Also, although not shown in FIG. 27, the conductive layer 30a of the first polycrystalline silicon layer 30 is electrically connected to the sub-emitter electrode SE. Thus, in the second modification, it is possible to effectively and securely prevent the inputting of the thermal noise from the epitaxial layers 12 and 16 into the base-bonding pad BP.

Figure 28:
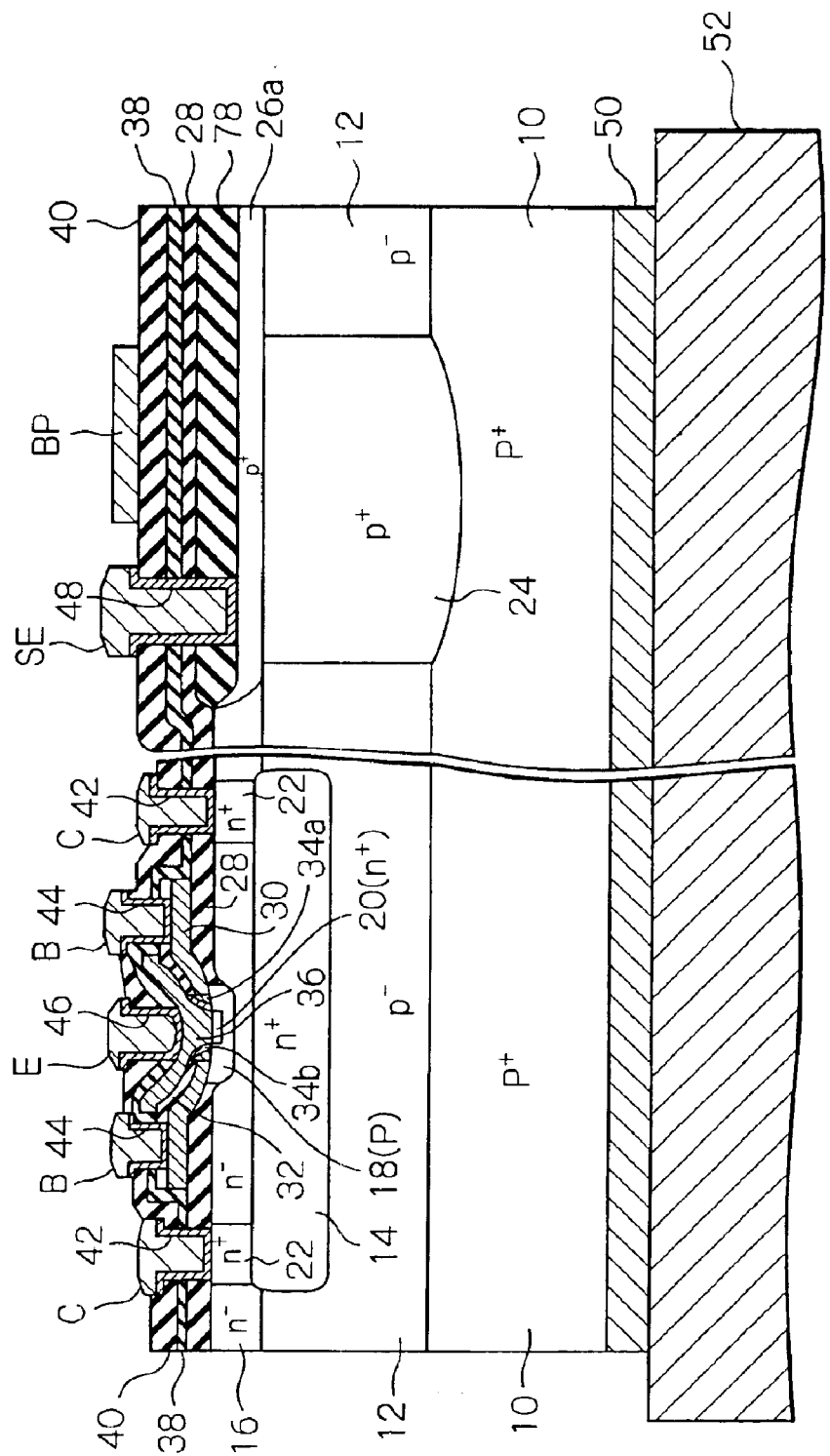
FIG. 28 is a cross-sectional view, corresponding to FIG. 2, showing a third embodiment of the semiconductor device including the bipolar junction transistor according to the present invention.

FIG. 28 shows a third embodiment of the semiconductor device including the bipolar junction transistor (BJT) according to the present invention. Note, in this drawing, the features similar to those of FIG. 2 are indicated by the same references.

In this third embodiment, a p⁺-type channel stopper region 26a is formed in the n⁻-type epitaxial layer 16 to cover the p⁺-type diffusion buried layer 24, and a field silicon dioxide layer 78 is then formed on the p⁺-type channel, using a Local Oxidation of Silicon (LOCOS) method. Then, a first insulation layer 28 and a first polycrystalline silicon layer 30 are formed and laminated in order on the n⁻-type epitaxial layer 16 having the field silicon dioxide layer 78, and are processed in substantially the same manner as in the above-mentioned first embodiment. Subsequently, a second insulation layer 32 and a second polycrystalline silicon layer 36 are formed and laminated in order on the first polycrystalline silicon layer, and are processed in substantially the same manner as in the above-mentioned first embodiment. Thereafter, third and fourth insulation layers 38 and 40 are formed as shown in FIG. 24.

In the third embodiment, a sub-emitter-contact hole is perforated in the first, third, and fourth-insulation layers 28, 38 and 40, and the field silicon dioxide layer 78, to thereby expose a local area of the $p^+$-type channel stopper region 26a, as shown in FIG. 28. An interior of the sub-emitter-contact hole is coated with a suitable metal to thereby form a barrier metal layer 48, and is filled with a conductive material such as metal or the like, resulting in formation of a sub-emitter electrode SE.

Of course, while the sub-emitter electrode SE is being formed, other electrodes C, B, and E are also formed in substantially the same manner as in the first embodiment, and a base-bonding pad BP is simultaneously formed on the fourth insulation layer 40, as shown in FIG. 28. Although not shown in FIG. 28, a wiring pattern is formed on the fourth insulation layer 40, to thereby establish, for example, an electrical connection between the emitter electrode E and the sub-emitter electrode SE, and an electrical connection between the base electrodes B and the base-bonding pad BP.

Although the BJT arrangement of the third embodiment is similar to that of a conventional emitter-grounded type high frequency BJT as disclosed in the aforesaid Patent Publications No. SHO-64-073669 and No. HEI-10-247713, the third embodiment should be distinguished from the conventional emitter-grounded type high frequency BJT in that the $p^+$-type channel stopper region 26a is widely extended so as to encompass the base-bonding pad BP, whereby the inputting of the thermal noise from the epitaxial layers 12 and 16 to the base-bonding pad BP can be securely prevented. In short, the $p^+$-type channel stopper region 26a functions as the $p^+$-type sub-emitter region 26 in the first embodiment.

Also, to produce semiconductor devices according to the third embodiment, it is possible to utilize conventional production facilities for producing the emitter-grounded type high frequency BJTs as they substantially stand, because the BJT arrangement of the third embodiment is similar to that of the conventional emitter-grounded type high frequency BJT.

Figure 29:
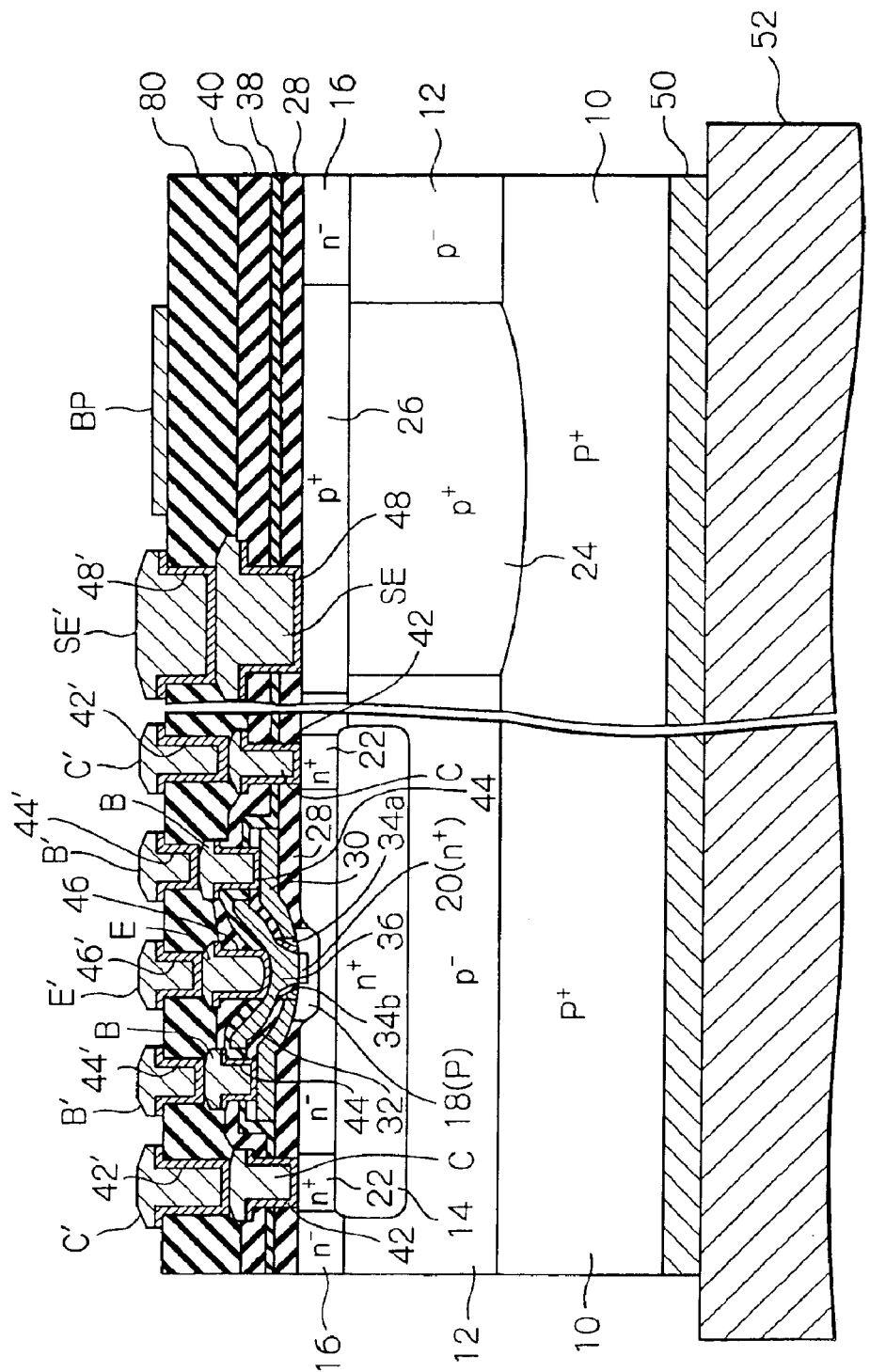
FIG. 29 is a cross-sectional view, corresponding to FIG. 2, showing a fourth embodiment of the semiconductor device including the bipolar junction transistor according to the present invention.

FIG. 29 shows a fourth embodiment of the semiconductor device including the bipolar junction transistor (BJT) according to the present invention. Note, in this drawing, the features similar to those of FIG. 2 are indicated by the same references.

In the above-mentioned first, second, and third embodiments, the wiring pattern (including the first, second, and third conducting paths P1, P2, and P3 (FIG. 1)) formed on the fourth insulation layer 40 is used to establish the electrical connection between the collector electrodes C and the collector-bonding pad CP, the electrical connection between the base electrodes B and the base-bonding pad BP, and the electrical connection between the emitter electrode E and the sub-emitter electrode SE. However, in the fourth embodiment, a first wiring pattern is formed on the fourth insulation layer 40 to thereby establish electrical connections among some not illustrated electrical terminals, which do not directly participate in the present invention.

In the fourth embodiment, the formation of the electrodes C, B, E, and SE is carried out in substantially the same manner as in the first embodiment, and a fifth insulation layer or additional insulation layer 80 is formed on the fourth insulation layer 40 after the formation of the electrodes C, B, E, and SE.

A pair of additional collector-contact holes are perforated in the additional insulation layer 80 so as to expose the collector electrodes C. An interior of each additional collector-contact hole is coated with a suitable metal to thereby form a barrier metal layer 42', and is filled with a conductive material such as metal or the like, resulting in formation of additional collector electrodes C', which are electrically connected to the collector electrodes C, respectively.

Also, a pair of additional base-contact holes are perforated in the additional insulation layer 80 so as to expose the base electrodes B. An interior of each additional base-contact hole is coated with a suitable metal to thereby form a barrier metal layer 44', and is filled with a conductive material such as metal or the like, resulting in formation of additional base electrodes B', which are electrically connected to the base electrodes B, respectively.

Further, an additional emitter-contact hole is perforated in the additional insulation layer 80 so as to expose the emitter electrode E. An interior of the additional emitter-contact hole is coated with a suitable metal to thereby form a barrier metal layer 46', and is filled with a conductive material such as metal or the like, resulting in formation of an additional emitter electrode E', which is electrically connected to the emitter electrode E. Furthermore, an additional sub-emitter-contact hole is perforated in the additional insulation layer 80 so as to expose the sub-emitter electrode SE. An interior of the additional sub-emitter-contact hole is coated with a suitable metal to thereby form a barrier metal layer 48', and is filled with a conductive material such as metal or the like, resulting in formation of an additional sub-emitter electrode SE', which is electrically connected to the sub-emitter electrode SE.

Similar to the first embodiment, each of the barrier metal layers 42', 44', 46' and 48' may be composed of titanium (T), titanium/tungsten (TW) or the like, and each of the additional electrodes C', B', E' and SE' may be composed of aluminum (Al), gold (Au) or the like.

When the aforesaid additional electrodes C', B', E' and SE' are formed, both a collector-bonding pad (not shown) and a base-bonding pad BP are simultaneously formed on the additional insulation layer 80. After the formations of the additional electrodes C', B', E' and SE' and the bonding pads, a second wiring pattern is formed on the additional insulation layer 80, to thereby establish an electrical connection between the additional collector-electrodes C' to the collector-bonding pad, an electrical connection between the additional base electrodes B' to the base-bonding pad BP, and an electrical connection between the additional emitter electrode E' to the additional sub-emitter electrode SE'.

Similar to the above-mentioned first embodiment, in the fourth embodiment, the $p^+$-type sub-emitter region 26 is widely extended so as to encompass the base-bonding pad CP, and thus it is possible to prevent the inputting of the thermal noise from the epitaxial layers 12 and 16 to the base-bonding pad BP, resulting in the improvement of the NF characteristic.

Figure 30:
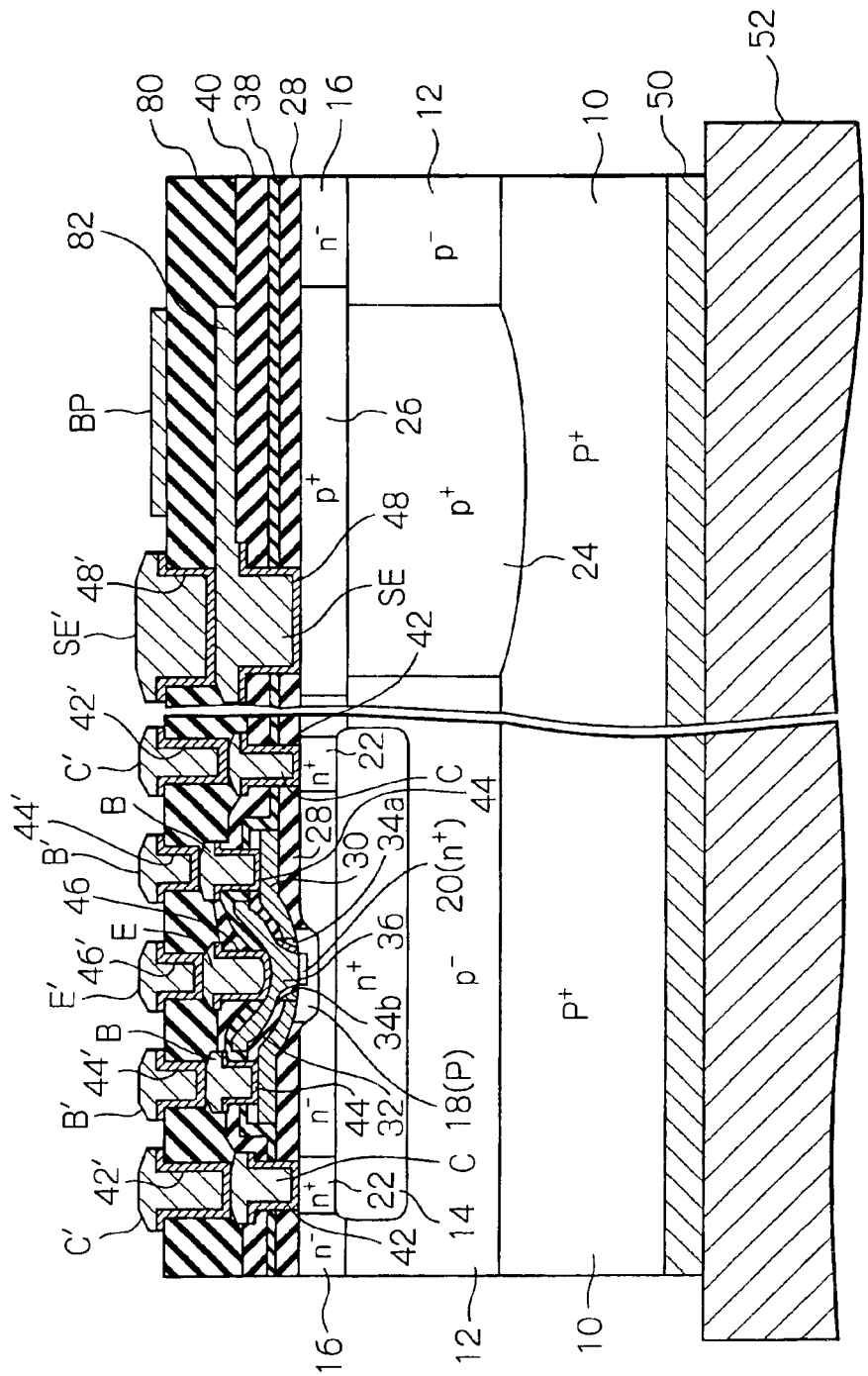
FIG. 30 is a cross-sectional view, corresponding to FIG. 2, showing a fifth embodiment of the semiconductor device including the bipolar junction transistor according to the present invention.

FIG. 30 shows a fifth embodiment of the semiconductor device including the bipolar junction transistor (BJT) according to the present invention. Note, in this drawing, the features similar to those of FIG. 9 are indicated by the same references.

The fifth embodiment is substantially identical to the fourth embodiment except that a head of the sub-emitter electrode SE has a grounded shield 82 which is integrally extended from the sub-emitter electrode SE so as to encompass the base-bonding pad BP, as shown in FIG. 30. Thus, according to the fifth embodiment, it is possible to securely and effectively prevent the inputting of the thermal noise from the epitaxial layers 12 and 16 to the base-bonding pad BP.

In all the above-mentioned embodiments, although the semiconductor device includes the NPN-type BJT, of course, it is possible to apply the present invention to a PNP-type BJT in substantially the same manner as stated above.

Finally, it will be understood by those skilled in the art that the foregoing description is of preferred embodiments of the device, and that various changes and modifications may be made to the present invention without departing from the spirit and scope thereof.

What is claimed is:

1. A semiconductor device comprising:
   a low resistance semiconductor substrate;
   a high resistance semiconductor layer formed on said low resistance semiconductor substrate;
   an insulation layer formed on said high resistance semiconductor layer;
   a transistor element composed of a collector region, a base region, and an emitter region which are formed in said high resistance semiconductor layer;
   an emitter electrode formed in said insulation layer so as to be electrically connected to said emitter region;
   a sub-emitter electrode formed in said insulation layer electrically connected to said emitter electrode;
   a low resistance impurity-diffusion region formed in said high resistance semiconductor layer such that said sub-emitter electrode is electrically connected to said low resistance semiconductor substrate through said low resistance impurity-diffusion region,
   wherein said lower resistance impurity-diffusion region extends veritcally from said insulation layer to said low resistance semiconductor substrate, and wherein the impurity is one conductor type;
   a base electrode formed in said insulation layer so as to be electrically connected to said base region; and
   a base-bonding pad formed on said insulation layer so as to be electrically connected to said base electrode,
   wherein said base-bonding pad is placed on said insulation layer above said low resistance impurity-diffusion region so as to be at least partially overlapped with said low resistance impurity-diffusion region.

2. A semiconductor device as set forth in claim 1, wherein said low resistance semiconductor substrate is grounded.

3. A semiconductor device as set forth in claim 1, wherein the electrical connection between said emitter electrode and said sub-emitter electrode is established by a conducting path formed on said insulation layer, and the electrical connection between said base electrode and said base-bonding pad is established by a conducting path formed on said insulation layer.

4. A semiconductor device as set forth in claim 1, wherein said insulation layer includes a conductive layer buried therein and electrically connected to said sub-emitter electrode, and said conductive layer is placed so as to at least partially overlap said base-bonding pad.

5. A semiconductor device as set forth in claim 4, wherein a part of said base-bonding pad is overlapped with said low resistance impurity-diffusion region, and the remaining part of said base-bonding pad is overlapped with said conductive layer.

6. A semiconductor device as set forth in claim 1, further comprising:
   a first wiring pattern formed on said insulation layer;
   an additional insulation layer formed between said insulation layer and both said base-bonding pad and said first wiring pattern;
   a second wiring pattern formed on said additional insulation layer;
   an additional emitter electrode formed in said additional insulation layer so as to be electrically connected to said emitter electrode;
   an additional sub-emitter electrode formed in said additional insulation layer so as to be electrically connected to said sub-emitter electrode;
   an additional base electrode formed in said additional insulation layer so as to be electrically connected to said base electrode; and
   an additional base-bonding pad formed on said additional insulation layer so as to be electrically connected to said base-bonding pad.

7. A semiconductor device as set forth in claim 6, wherein said sub-emitter electrode has a grounded shield which is integrally extended therefrom between said insulation layer and said additional insulation layer, so as to overlap said base-bonding pad.

8. A semiconductor device as set forth in claim 6, wherein said second wiring pattern includes a conducting path for establishing an electrical connection between said additional emitter electrode and said additional sub-emitter electrode, and another conducting path for establishing an electrical connection between said base electrode and said base-bonding pad.

9. A semiconductor device as set forth in claim 1, wherein said low resistance semiconductor substrate exhibits a first conductivity type; said high resistance semiconductor layer includes a first high resistance epitaxial layer section formed on said low resistance semiconductor substrate and exhibiting the first conductivity type, and a second high resistance layer section formed on said first high resistance epitaxial layer and exhibiting a second conductivity type opposite to the first conductivity type; and said low resistance impurity-diffusion region includes a first low resistance impurity-diffusion region section formed in said first high resistance epitaxial layer section and exhibiting the first conductivity type, and a second low resistance impurity-diffusion region section formed in said second high resistance epitaxial layer section and exhibiting the first conductivity type.

10. A semiconductor device as set forth in claim 9, wherein said second low resistance impurity-diffusion region section is formed as a channel stopper region exhibiting the first conductivity type.

* * * * *